(12) United States Patent
Risbo et al.

(10) Patent No.: US 6,657,566 B1
(45) Date of Patent: Dec. 2, 2003

(54) CONVERSION OF A PCM SIGNAL INTO A UPWM SIGNAL

(75) Inventors: Lars Risbo, Copenhagen (DK); Hans K. Andersen, Copenhagen (DK)

(73) Assignee: Texas Instruments Denmark A/S, Aalborg SV (DK)

( * ) Notice: Subject to any disclaimer, the term of this patent is extended or adjusted under 35 U.S.C. 154(b) by 0 days.

(21) Appl. No.: 09/155,225

(22) PCT Filed: Mar. 26, 1997

(86) PCT No.: PCT/DK97/00133

§ 371 (c)(1),
(2), (4) Date: Oct. 22, 1998

(87) PCT Pub. No.: WO97/37433

PCT Pub. Date: Oct. 9, 1997

(30) Foreign Application Priority Data

Mar. 28, 1996 (DK) .............................................. 0355/96

(51) Int. Cl.[7] .............................................. H03M 5/08
(52) U.S. Cl. .......................... 341/53; 341/143; 375/242
(58) Field of Search ................................ 341/143, 140, 341/138, 53; 375/242, 243, 237, 238

(56) References Cited

U.S. PATENT DOCUMENTS

| 5,021,788 A | 6/1991 | Ueki et al. ................... 341/152 |
| 5,027,119 A | 6/1991 | Toyomaki .................... 341/144 |
| 5,548,286 A | 8/1996 | Craven ........................ 341/126 |
| 6,014,055 A | * 1/2000 | Chester ........................ 330/10 |

FOREIGN PATENT DOCUMENTS

| DE | 39 16 482 | 11/1990 | ............ H03M/1/82 |
| EP | 0 573 472 | 2/1992 | ............ H03M/1/82 |
| WO | WO 92/11699 | 7/1992 | ............ H03M/1/82 |
| WO | WO 92/15153 | 9/1992 | ............ H03M/1/82 |
| WO | WO 95/06980 | 3/1995 | ............ H03M/1/06 |
| WO | 98/19391 | 5/1998 | ........... H03F/3/217 |

OTHER PUBLICATIONS

Apr. 1992, Hawksford, M., "Dynamic Model–Based Linearization of Quantized Pulse–Width Modulation for Applications in Digital–to Analog Conversion and Digital Power Amplifier Systems", *Journal of Audio Engineering Society*, vol. 40, No. 4, pp. 235–252.

Nov. 1995, Brieghel, Henrik, "Europe's utility model initiative", *Managing Intellectual Property*, 18–20.

Sep. 1990, Hiorns, R. et al., "Realizing an all Digital Power Amplifier", *An Audio Engineering Society Preprint*, No. 2960. Session–Paper E–6.

(List continued on next page.)

*Primary Examiner*—Peguy JeanPierre
(74) *Attorney, Agent, or Firm*—Merchant & Gould P.C.

(57) ABSTRACT

To correct non-linearity and noise in the conversion of a pulse code modulated signal (PCM) into a uniform pulse width modulated signal (UPWM), a model is made of the known non-linearity in the conversion by dividing a plurality of non-linearity components in the model, where the polynomial components are separately weighed with filter coefficients. The model is used as a basis for the construction of a filter of the Hammerstein type whose non-linear parts consist of a division of the PCM signal into a plurality of powers, and whose linear parts are approximated by means of the model made. With the circuit of the invention it is now possible to construct a purely digital amplifier which has a great efficiency, low weight, etc.

52 Claims, 17 Drawing Sheets

OTHER PUBLICATIONS

Jul. 1966, Narendra, K. et al, "An Interative Method for the Identification of Nonlinear Systems Using a Hammerstein Model", *IEEE Transactions on Automatic Control*, pp. 546–550.

Copy of International Search Report for PCT/DK97/00133.

Lennart Ljung; System Identification: Theory for the User; 1987.

J. Vanderkooy: "New Concepts in Pulse–Width Modulation", AES, 97th Convention, Nov. 10–13, 1994.

J. Vanderkooy et al.: "Relationships between noise shaping and nested differentiating feedback loops", AES, 93rd Convention, Oct. 1–4, 1992.

B. Attwood: Very high fidelity quartz controlled PWM (Class D) stereo amplifiers for consumer and professional use, 59th Convention, Feb./Mar. 1978.

O. Bonello: "Advanced negative feedback design for high performance amplifiers", 68th Convention, Mar. 17–20, 1981.

B. Attwood: "Design parameters important for the optimization of very–high–fidelity PWM (class D) audio amplifiers", J. Audio. Eng. Soc., vol. 31, No. 11, Nov. 1983.

E. Cherry: "Nested Differentiating Feedback Loops in Simple Audio Power Amplifiers", J. Audio. Eng. Soc., vol. 30, No. 5, May 1982.

E. Cherry: "Feedback, sensitivity and stability of audio power amplifiers", J. Audio. Eng. Soc., vol. 30, No. 5, May 1982.

J. Hancock: "A class D amplifier using MOSFETs with reduced minority carrier liftime", J. Audio. Eng. Soc., vol. 39, No. 9, Sep. 1991.

Anderskouv et al.: "High fidelity pulse width modulation amplifiers based on novel double loop feedback techniques", AES, 100th Convention, May 11–14, 1996.

Hirons et al., "Developments in Realising and All Digital Power Amplifier", AES, 1991.

Niels Anderskouv, "Analog input klasse D forstærker til audio", Sep. 25, 1995, Institute for Automation Danmarks Tekniske Universitet DK–2800 Lyngby. pp 57–121.

Dec. 1991, Proceedings of the 30th Conference on Decision and Control.

1994, Ouladsine et al.; Identification using the Hammerstein Model; vol. 35, No. 2, p132.

"Analysis and Parameter Estimation of Nonlinear Systems with Hammerstein Model Using Taylor Series Approach" Hung–Yuan Chung and York–Yih Sun; IEEE transaction on Circuits and Systems, vol. 35, No. 12 Dec. 1988, pp. 1539–1541.

"Adaptive Linearization of a Loudspeaker" by Franklin X.Y. Gao and W. Martin Snelgrove; Interactive Voice Technology, Bell–Northern Research Ltd. pp. 3589–3593, Jul. 1991.

System Identification: "Theory for the User", Lennart Ljung. (1997) pp. 132, 518.

* cited by examiner

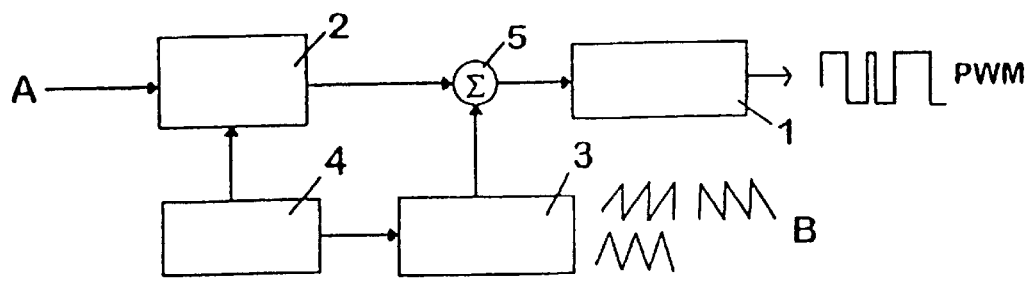
FIG. 1
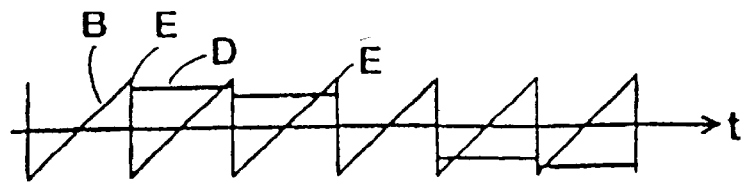
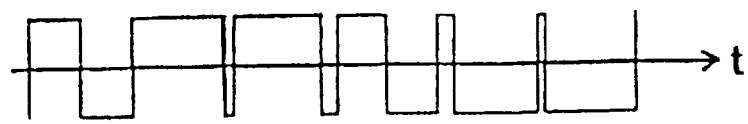
FIG. 2
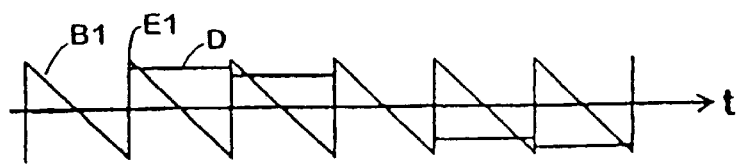
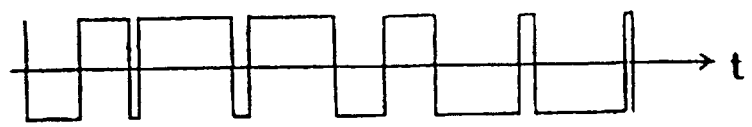
FIG. 3
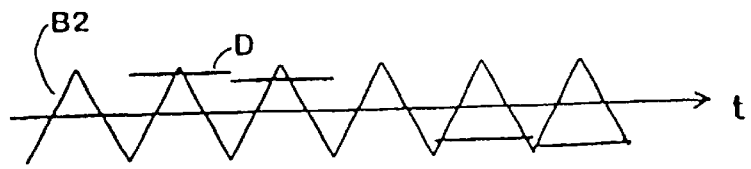
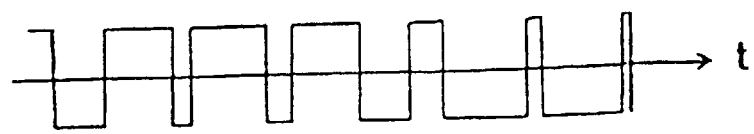
FIG. 4

CONVERSION OF A PCM SIGNAL INTO A UPWM SIGNAL

The invention relates to a method for use in the correction of non-linearity and noise in the conversion of a PCM signal into a UPWM signal.

Such a conversion of a digital signal into a pulse width modulated signal may advantageously be used in connection with power amplifiers which are of the class D type. In connection with digital sound sources, such as compact disc players, where the sound signals are pulse code modulated, a conversion of the pulse code modulation into pulse width modulation will make it extremely suitable for the connection of a class D amplifier. The class D amplifier primarily has the advantage that it has a very high efficiency, which means that it may be constructed with a low weight while maintaining an extremely high output power, it being possible to achieve an efficiency of almost 95% for a class D amplifier. Further, connection of a digital sound source and a class D amplifier will allow analog signal processing to be avoided, which is an advantage in the signal processing.

Thus, it is desirable to be able to convert a pulse code modulated signal into a pulse width modulated signal without the information in the pulse code modulating signal being changed in the conversion.

It has been known for many years that the conversion of a pulse code modulation signal into a pulse width, modulated signal is non-linear by nature.

Several methods have been proposed in the course of time for the correction of this non-linearity, which is fundamentally necessary if a digital sound source, such as a compact disc player, is to be used in connection with an amplifier to which a pulse width modulated signal is fed as an input signal.

In addition to the inevitable non-linearity, the conversion of the pulse code modulation signal into the pulse width modulation signal generates noise which also has to be corrected if the orignal information from a digital sound source is to be reproduced correctly.

This noise occurs since the PWM signal is desirably formed as a digital signal, which means that all level switchings take place synchronously with a bit clock which has a limited frequency. Thus, the UPWM signal must be capable of being formed by a digital circuit which gives rise to a coarse quantization and thereby noise.

Examples of methods for the elimination of error sources which occur if a pulse code modulation signal is converted into a pulse width modulated signal include:

Use of oversampling, which means that the switching frequency is considerably greater than is necessary according to the sampling theorem in the generation of the pulse width modulated signal which is used in the pulse code modulation. However, too strong oversampling is not desirable in practical uses, because this inevitably creates noise. Problems will primarily occur with a class D output stage which is to switch correspondingly rapidly.

Although, as mentioned above, the noise, also called quantization noise, can be reduced using so-called noise shaping, where the quantization noise at high frequencies is amplified, while the noise from the lower frequencies is removed, but the interaction of the quantization noise with the non-linear pulse width modulation gives rise to so-called intermodulation noise, causing a new error source called intermodulation noise (IM noise) to be generated by noise shaping, which means that the advantageous effect of the noise shaping is reduced.

The published international patent application No. WO 92/15153 discloses a method of correcting non-linearity and correcting deterministic distortion as well as intermodulation noise. The document describes a plurality of complex circuits including look-up tables, used for the determination of parameters, for use in the feedback to suppress the deterministic distortion and the intermodulation noise. In practice, however, it is necessary to use look-up tables of a considerable extent, which will hardly be easy to implement, in connection with pulse code modulation signals of 16–24 bits.

The published international patent application No. WO 92/11699 discloses an equalization method based on an imitation of the naturally sampled PWM. The method has no effect on the inevitably occurring intermodulation noise as well as possible. noise which is generated if a so-called quasi-symmetrical uniform pulse width modulation is used. Further, the method cannot be applied in connection with all UPWM forms (e.g. double-sided, symmetrical).

SUMMARY OF THE INVENTION

As a starting point for the invention it is desired to provide a new and better method of modelling, and thereby also predicting, the non-linearity of a pulse code modulation to a pulse width modulation conversion process.

As will appear from the following, it has been found that the use of so-called Hammerstein filters, which generally consist of a static non-linearity followed by a linear, time invariant filter, is extremely suitable for the correction of several of the error sources which occur in pulse code modulation to pulse width modulation.

Of these error sources, in particular the following four ones are interesting in connection with the present invention:

1. Quantization noise because of the time discretization of pulse width information.
2. Intermodulation noise which is created by the uniform pulse width modulation because of quantization and noise shaping.
3. Noise because of the use of quasi-symmetrical uniform pulse width modulation.
4. Deterministic harmonic distortion.

Thus, it is desirable to provide some correction circuits which each are directed to the above-mentioned error sources 1–4.

As will appear from the following, the error sources 1–3 will be corrected by simple feedback circuits, while the error source 4 will be corrected by signal feedforward.

The object of the invention is to provide a method for use in the correction of the errors which occur in the conversion of pulse code modulation into a pulse width modulation, thereby minimizing non-linearities and noise which inevitably occur in connection therewith.

The object is achieved by designing a model circuit for the known non-linearity in the PCM to UPWM conversion, said model circuit being formed by parallel-connected Hammerstein filters which divide the PCM signal into their respective polynomial components, each of said polynomial components being filtered with a linear and time invariant filter associated with the power l and having the transfer function:

$$A_l(z) = \sum_i a_{il} z^i,$$

where $z=e^{j\omega}$
following which the filtered components are summed, with $z=e^{j\omega}$, where $\omega=2\pi f/f_s$ represents the normalized angle frequency and $f_s$ is the sampling frequency and $a_{i1}$ represents the filter coefficient associated with the power 1 and time index 1.

This ensures that the non-linearity in the pulse code modulation to pulse width modulation may be modelled, without complicated table-based memories having to be used. Thus, instead, use is made of a method which may be implemented by simple circuits consisting of Hammerstein filters.

It is expedient that the non-linear polynomial components are determined by a Taylor development of the pulse code modulation signal.

It is expedient that in a UPWM trailing edge modulation the coefficients of the filters are determined so as to achieve the following transfer functions:

$$A_l(\omega) = \frac{1}{l!}\left(\frac{-j\omega}{2}\right)^{(l-1)}$$

It is expedient that in a UPWM leading edge modulation the coefficients of the filters are determined so as to achieve the following transfer functions:

$$A_l(\omega) = \frac{1}{l!}\left(\frac{j\omega}{2}\right)^{(l-1)}$$

According to the method, it is moreover expedient that in an UPWM double-sided symmetrical modulation the filter coefficients are determined so as to achieve the following transfer functions:

$$A_1(\omega) \approx \begin{cases} \frac{1}{1!}\left(\frac{j\omega}{4}\right)^{(l-1)}, \text{ for odd } 1 \\ \frac{1}{1!}\left(\frac{j\omega}{4}\right)^{1}, \text{ for even } 1 \end{cases}$$

It is noted that a more linear process is obtained when using double-sided symmetrical uniform pulse width modulation.

The invention also concerns a circuit for correcting non-linearity and noise in the conversion of a PCM signal into a UPWM signal.

This circuit is characterized in that the PCM signal is fed to a plurality of parallel-connected Hammerstein filters which divide the PCM signal into their respective polynomial components which each are filtered with a linear filter belonging to the power 1 and having the transfer function $B_1(\omega)$, adapted to equalize the non-linear contributions caused by the PCM-UPWM conversion, said $B_1(\omega)$ being approximated on the basis of the knowledge of the model circuit as previously disclosed herein, following which the filtered components are fed to a summation unit.

This provides a circuit which is simple to realize, and which is based exclusively on signal feedforward, which causes no problems of stability.

For optimum realization of the circuit, it is an advantage that a time delay circuit is inserted after the 1st order component.

To remove the noise which, as mentioned before, inevitably occurs in discretization of the PCM signal, it is expedient that the input of the noise shaper is associated with a summation unit which, in addition to receiving the PCM signal, is adapted to receive and subtract a feedback signal derived as the difference between the output signals of two UPWM models as previously disclosed herein, wherein the input signal to the first model, which is a first Hammerstein filter, is formed by the PCM signal, and the input signal to the second model, which is a second Hammerstein filter, is formed by the output signal of the noise shaper.

The PCM signal may be corrected in connection with the use of quasi-symmetrical modulation by feedback from a Hammerstein filter whose non-linear part is formed by a generator signal g(k), which, dynamically, is an indication of the selected symmetry form and pulse width for the modulated pulse associated with the time index k, and whose linear part is a time invariant filter having the transfer function $C(\omega)$.

It is advantageous if the generator signal g(k) is given by:

$$g(k)=s(k)(x(k)+1)$$

where (x(k)+1) represents the width of the pulse at time index k and s(k) represents the time shift with respect to symmetrical modulation of the pulse at time index k expressed in half bit clock periods $T_b$, and where $C(\omega)$ is approximated by the transfer function:

$$C(\omega) = j\omega\frac{T_b}{2\Delta T}$$

where $T_b$ is the cycle time of the bit clock, while $\Delta T$ represents the cycle time of the UPWM signal.

Finally, the invention relates to use with a class D amplifier or equipment for digital-to-analog conversion.

The invention has the advantage that it allows construction of a digital amplifier in which analog calculation circuits are not used at any time.

As explained above, the invention thus provides circuits which are all based on Hammerstein filters which, as mentioned before, in principle consist of a non-linear circuit followed by a linear and time invariant filter. Thus by applying the principles of the method according to the invention it is possible to construct circuits capable of correcting non-linearities as well as noise, including intermodulation noise which inevitably occur in connection with digital signal processing. In short, it has now been made possible to construct purely digital amplifiers without analog signal processing and without using A/D, D/A converters.

BRIEF DESCRIPTION OF THE DRAWINGS

The invention will now be explained more fully with reference to an embodiment of the invention shown in the drawing, in which FIG. 1 shows a uniform pulse width modulator, UPWM modulator, FIG. 2 shows the principle of a uniform sampling, with trailing edge modulation, FIG. 3 shows the principle of a uniform sampling, with leading edge modulation, FIG. 4 shows the principle of a uniform sampling, with double-sided modulation.

DETAILED DESCRIPTION OF THE PREFERRED EMBODIMENT(S)

Figure 5:
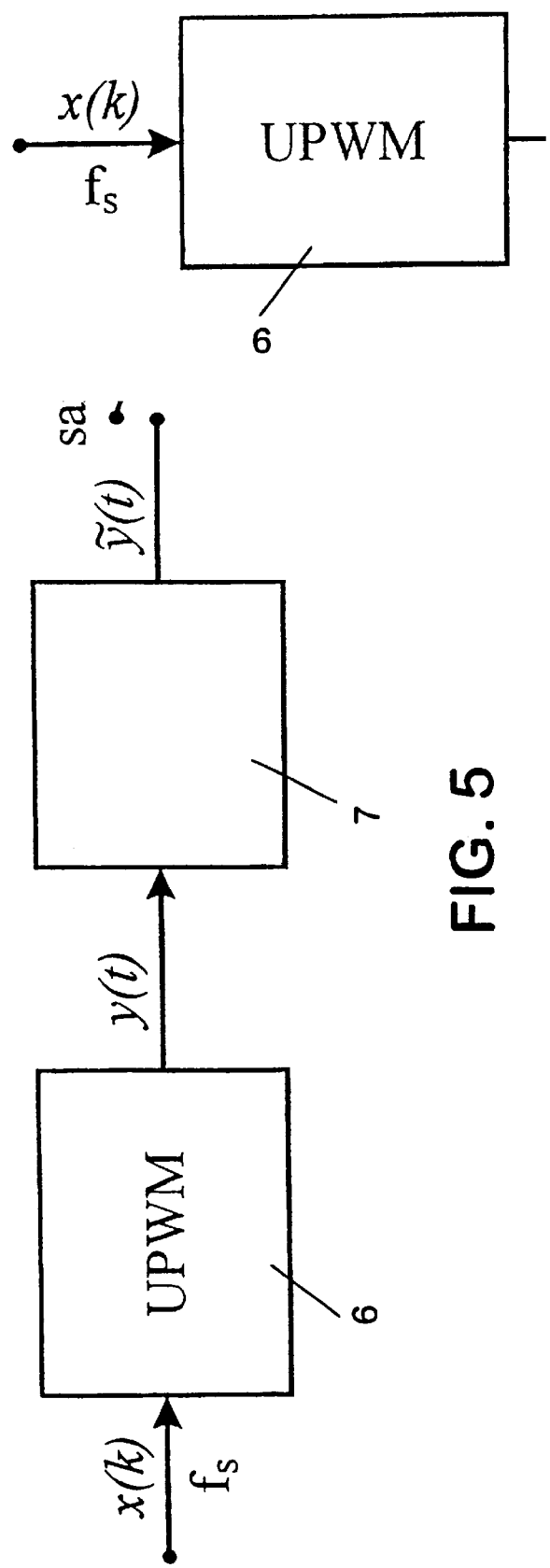
FIG. 5 shows a model of the principles of the invention.

FIG. 1 shows the principle for a pulse width modulator of the uniform type constructed by means of analog building blocks. The circuit consists of a comparator unit 1 which receives the sum of two signals on its input, one of said signals originating from a sawtooth/triangular generator 3, the other of said signals coming from a sample-and-hold unit 2, whose input receives e.g. an audio signal A which is fed via a sample-and-hold circuit to the other input of the comparator 1. Additionally, the circuit comprises a synchronization unit 4 so that the sawtooth/triangular generator 3 may be synchronized with the sample-and-hold unit 2. The fundamental mode of operation of the circuit will now be explained in connection with FIGS. 2–4.

FIG. 2 shows an example of a so-called trailing edge modulation where the input signal is sampled each time the sawtooth has reached the point E. The signal from the sample-and-hold unit 2 is added to the sawtooth signal in the summation unit 5, and as long as the sawtooth signal has a value which is lower than the signal from the sample-and-hold unit 2, a pulse will occur on the output of the comparator unit 1, while when the value of the sawtooth signal exceeds the signal D, a signal which is "low" will occur on the input of the comparator unit 1.

FIG. 3. differs from FIG. 2 by the shape of the sawtooth, thereby providing the so-called leading edge modulation. When using leading edge modulation, the mode of operation of the circuit in FIG. 1 is the same as when using trailing edge modulation.

Finally, FIG. 4 shows a so-called double sided modulation where the circuit 3 generates a triangle. As will be seen in FIG. 4, pulses occur when the signal B2 has a lower value than the signal D. With respect to the modulation forms in FIGS. 2 and 3, it may be said that the pulses are generated in that the two edges of the pulses are both shifted as a function of the sampled value from the sample-and-hold unit 2.

To illustrate the principles of the invention, reference may be made to the model in FIG. 5. In the UPWM converter 6 (uniform pulse width modulation), a discrete-time digital signal x(k) is converted into a time continuous signal y(t). The time discrete (PCM) signal x(k) corresponds to the output signal of the sample-and-hold unit 2 in FIG. 1. The result of the subsequent pulse width modulation, i.e. the time continuous signal y(t), is produced in that each sample of x(k) determines the course of y(t) within a sampling time interval of the duration $\Delta T$. This UPWM conversion is a non-linear process where an amplitude input is imaged into the time domain (pulse width).

For this non-linearity to be corrected digitally, it is necessary to make a model which forms an equivalent discrete-time signal y(k) which represents the time continuous signal y(t) generated by UPWM. According to the sampling theorem, this may be achieved by band limitation (lowpass filtering of y(t)), said signal, after band limitation, being sampled synchronously with the discrete-time signal x(k). This results in the time discrete signal y(k) which represents the output signal of the UPWM conversion in a time discrete form.

The ideal lowpass filter 7 in FIG. 5, given by the pulse response h(t), has a real transfer function with a constant and positive value below $f_g$, where $f_g$ is one half of the sampling frequency, i.e. $f_g=f_s/2$. This filter ensures that the sampling frequency is observed.

Figure 6:
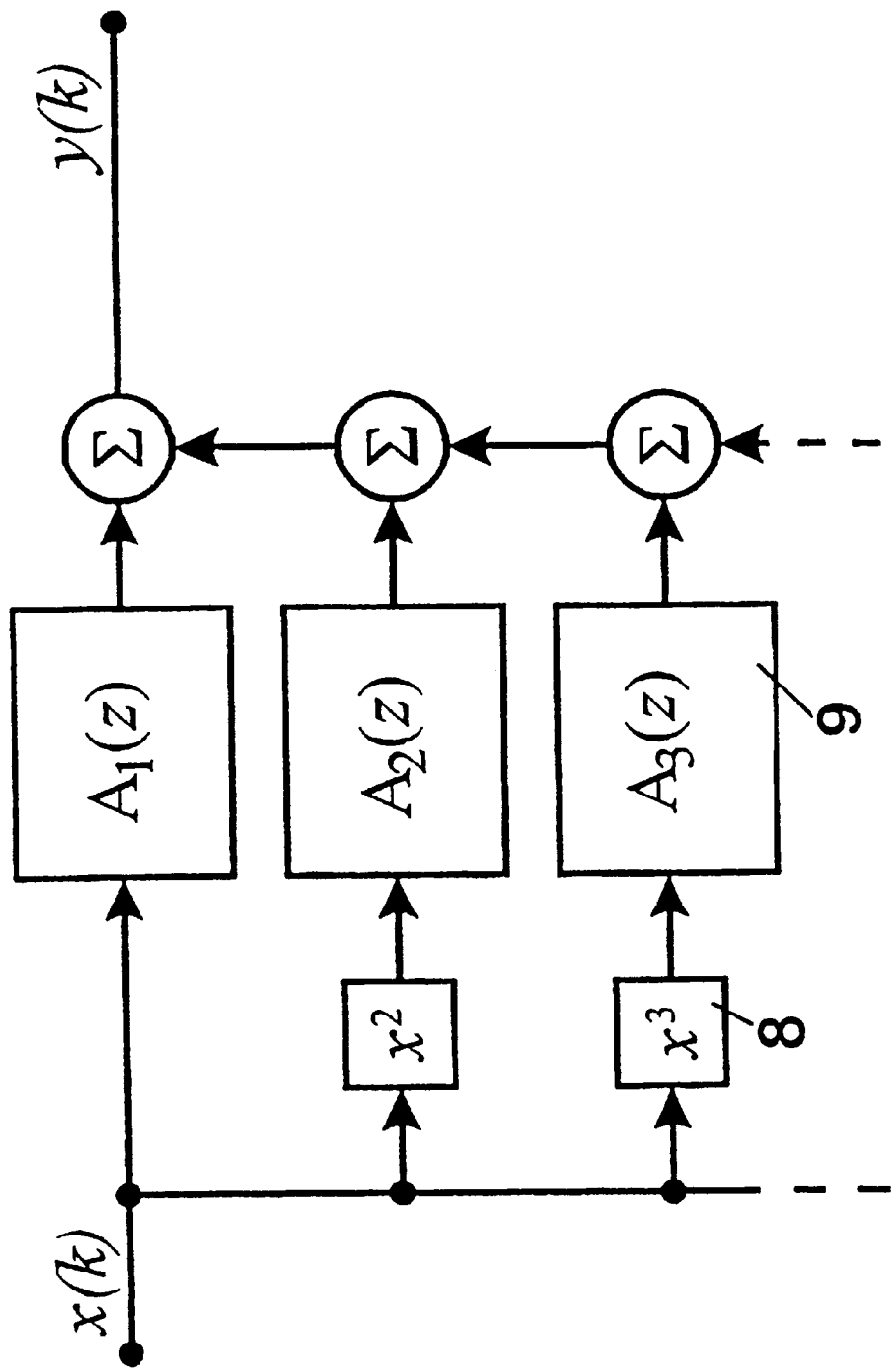
FIG. 6 shows the principles of the invention in connection with Hammerstein filters.

It may be shown (see Appendix A) by a Taylor development of the resulting signal y(k) that y(k) may be formed by a signal model as illustrated in FIG. 6. The input signal x(k) is divided into polynomial components of the form $x^l(k)$ which each are filtered with linear time invariant (LTI) filters $A_l(z)$. This is followed by summation resulting in y(k).

Thus, the model, cf. FIG. 6, is composed of an infinity of submodels which consist of a static non-linearity 8 consisting of involution to the lth power followed by an associated discrete-time linear and time invariant (LTI) filter 9 having the transfer function $A_l(z)$. This submodel belongs to the class of Hammerstein models.

It will be realized in connection with the error model above that distortion components generally depending on the frequency occur. In Appendix A, direct transfer functions belonging to various UPWM forms are derived. It is common to all UPWM forms that the distortion increases with the frequency.

Owing to the non-linear nature of UPWM it will be desirable to supply some "anti-distortion" to the input signal before the UPWM unit so that this unit is equalized.

This may be done by using a new Hammerstein-based non-linear filter which has to be inverse to the PCM-UPWM model. As a result, only feedforward of correction signals will occur—which means that there are no problems of stability like in feedback.

Figure 7:
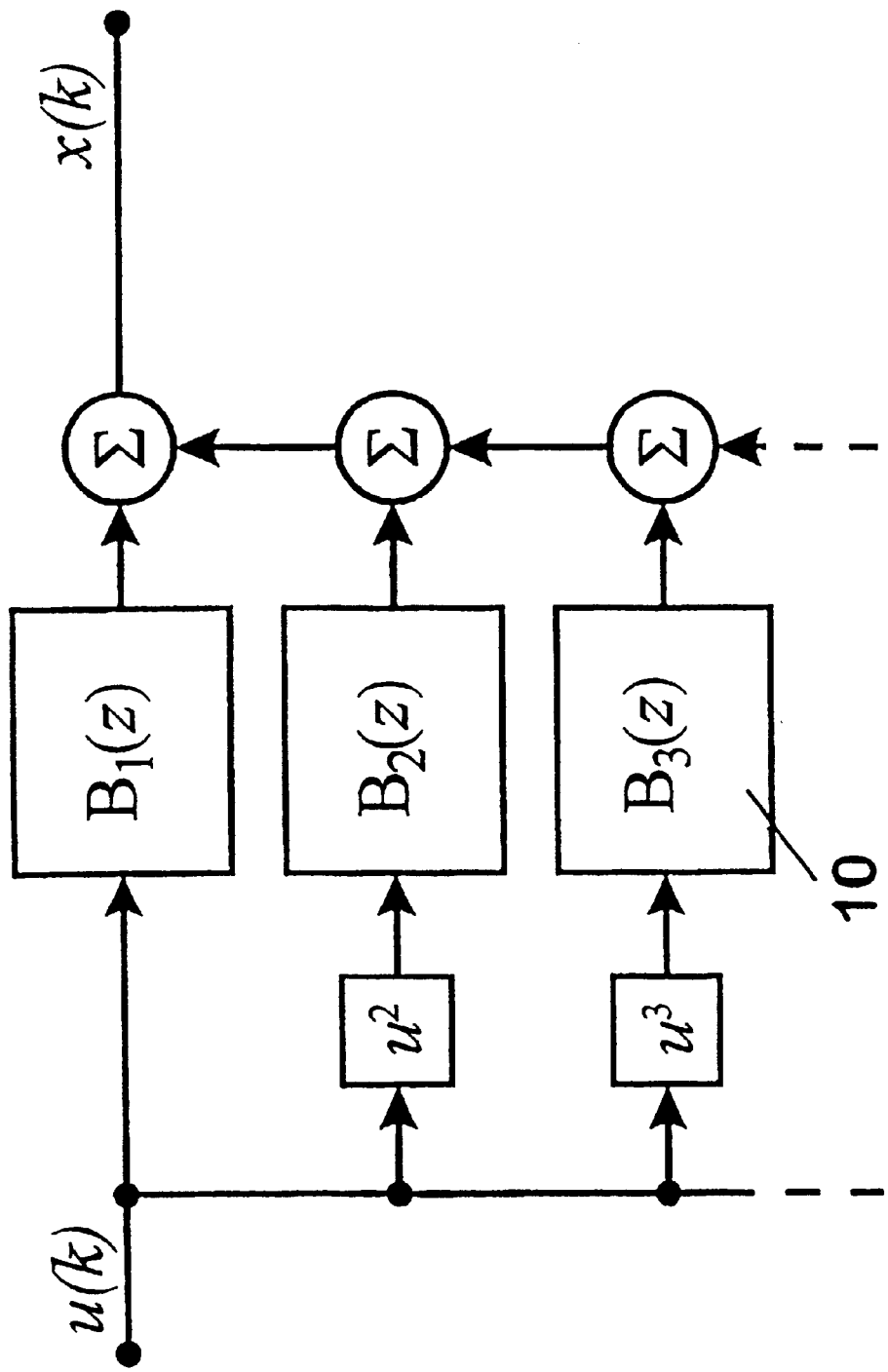
FIG. 7 shows a model of circuit for the equalization of UPWM according to the invention.

Such a system may have the appearance shown in FIG. 7. The figure shows how it is attempted to equalize the distortion in the UPWM model by means of a non-linear pre-filter of the Hammerstein type. The system in FIG. 7 will thus be inserted before the UPWM conversion, which may be modelled with the Hammerstein model in FIG. 6, as shown before.

As a starting point, it may be assumed that the UPWM process (modelled in FIG. 6) is so linear as to directly enable the use of an equalization filter where the sign of the non-linearities is reversed. However, this will not result in a total linearization of the complete system. The reason is that the supply of "anti-distortion components" itself has the side effect that additional higher order distortion is generated because of the non-linear nature of the UPWM unit. These distortion components will be called "false" in the following. For example, the sum of the input signal itself and the 2nd order contribution as defined by $B_2(z)$ will form 3rd order false products (because of the $x^2$ non-linearity in the UPWM part).

The problem of false contributions may be solved by correcting the $B_1(z)$ filters so that also the false components are corrected. The procedure comprises starting by setting $B_2(z)=-A_2(z)$ (where $A_2(z)$ is given for the modulation form concerned—see Appendix C). Then the size of the false 3rd order component is calculated, and the result is included in $B_3(z)$ so that all 3rd order contributions are neutralized. Then the size of the false 4th order components is determined (i.e. 1st+3rd) and (2nd+2nd)), and this is included in the selection of $B_4(z)$. Above a certain order, the size of the false components will have fallen to an acceptable level, and the process is stopped. Appendix C describes this process in detail with exact formulae for $B_1(\omega)$ up to l=4. The derivation of the correction circuit fed forward is directly conditional upon the knowledge of a model for UPWM.

Till now the invention has been explained solely by means of models in which causal filters occur, i.e. filters which are not realizable in the real world. The filters $B_1(z)$ (all of which are LTI) must of course be realizable (causal) in contrast to $A_1(z)$ which represents a generally acausal model.

Figure 8:
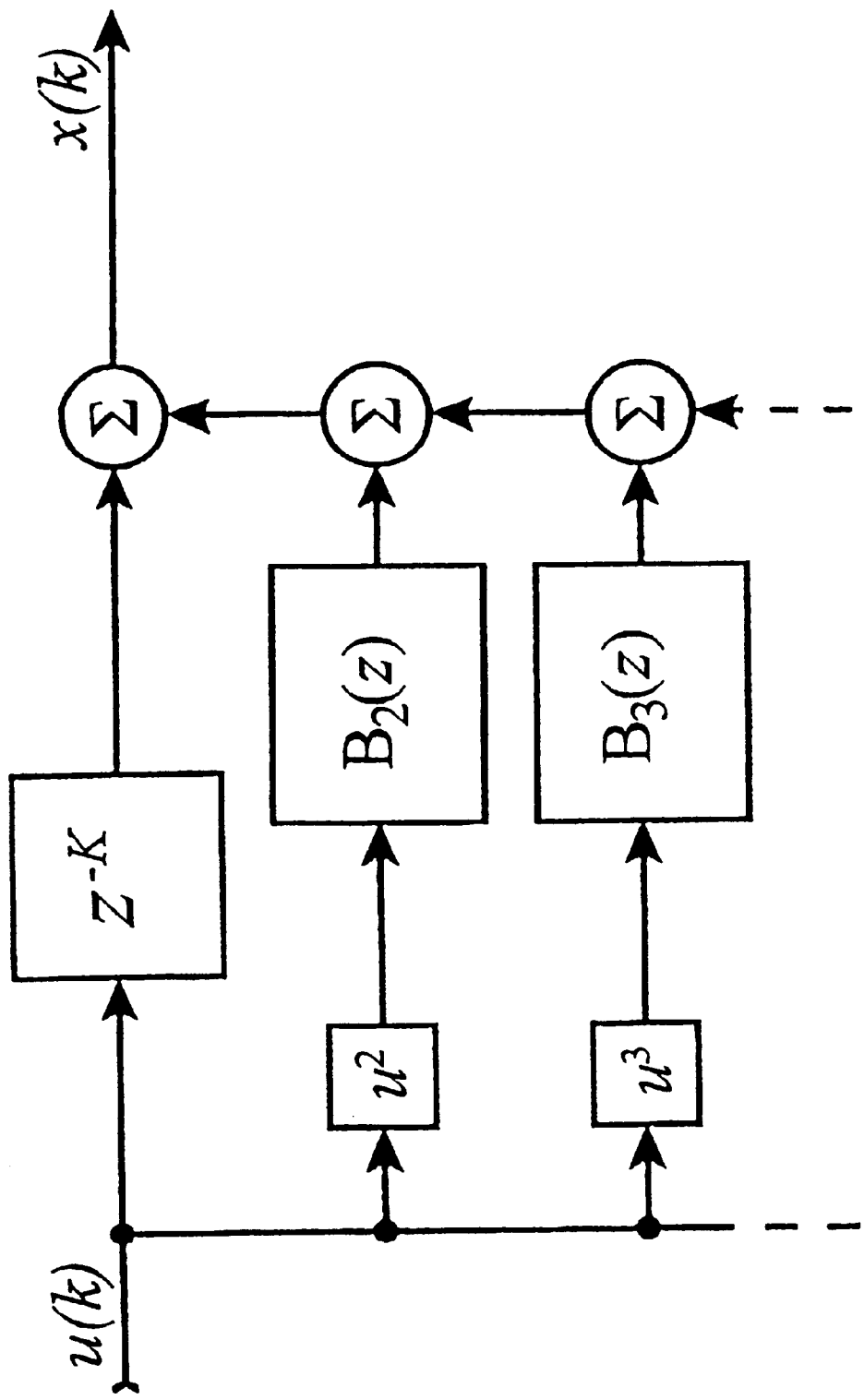
FIG. 8 shows a realizable circuit corresponding to FIG. 7.

A practical circuit for insertion after the PCM signal may naturally be based on FIG. 7. The filters 10 used must both be causal (i.e. realizable) and be capable of approximating generally acausal transfer functions (which are given e.g. by the formulae (m), (n) and (r) in Appendix A which are all either purely real or purely imaginary). The approximation may be improved considerably by accepting a delay through the entire circuit, which may be done in that all branches contain a pure delay of e.g. K samples. The linear branch with $B_1(z)=1$ is thus replaced by a pure digital K sample delay 13, which has the transfer function $z^{-K}$ in the z domain. This is illustrated in FIG. 8. The non-linear branches may then be realized with filters 10 $B_1(z)$, which are e.g. of the FIR (Finite Impulse Response) type with 2K+1 coefficients. Reference is made to Appendix B for the approximation itself.

If the uniform pulse width modulation of a PCM signal is to be performed by a digital circuit, it is necessary that the pulse width modulated signal is a time discrete signal. This means in practice that the pulse edges are synchronous with a clock signal (also called the bit clock with the frequency $f_b$). The pulse widths achievable are hereby discretized to a whole multiple of the bit clock period $T_b$. The bit clock is selected such that a sampling time interval $\Delta T=1/f_s$ corresponds to a whole number of bit clock periods, i.e. $\Delta T=N \cdot T_b$, where N is the number of possible pulse widths. For single-sided modulation it is thus necessary to have a bit clock frequency of $f_b=N \cdot f_s$, where N is the number of pulse widths. However, the formation of double-sided symmetrical UPWM requires a bit clock frequency of $f_b=2N \cdot f_s$ because of the symmetry requirement. In other words, a doubling of the bit clock frequency.

The discretization of the pulse widths reduces the readily achievable accuracy of a PCM to UPWM conversion system. The inaccuracy is in the form of quantization noise, the PCM signal having to be rounded off to a discrete number of amplitude levels (quantized). If e.g. a 16 bit PCM signal is to be converted with full accuracy, a bit clock frequency $f_b=2^{16} \cdot f_s$ is required. Such a bit clock frequency cannot be achieved in practice. To reduce the necessary bit clock frequency, the prior art therefore uses a so-called noise shaper immediately before the UPWM conversion. Combined with the use of oversampling, the noise shaper can suppress the quantization noise in the audible range at the expense of increased quantization noise at high frequencies above the audible range.

Figure 9:
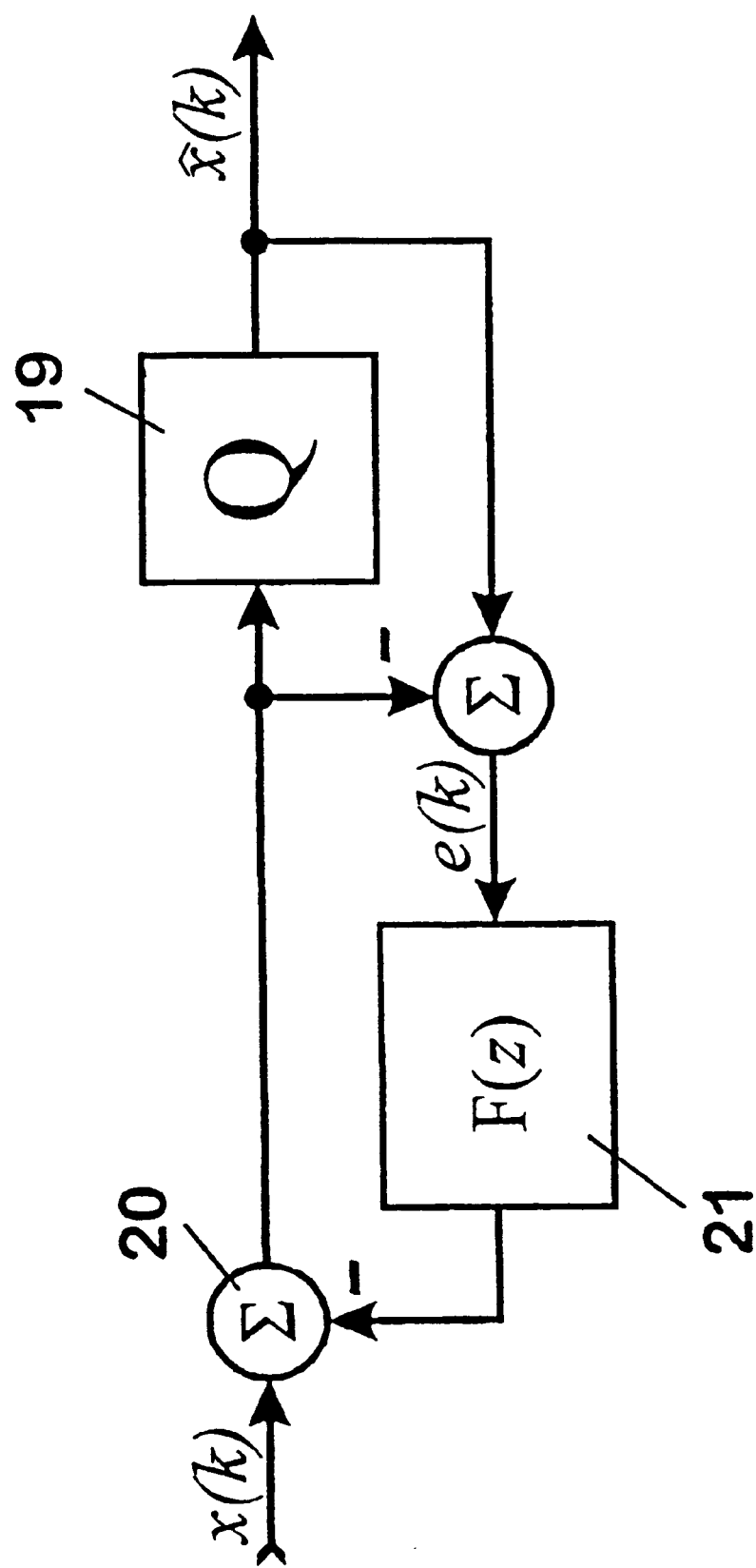
FIG. 9 shows the structure of a known noise shaper.

FIG. 9 shows an ordinary noise shaper which is adapted to correct the inevitable quantization noise which is fed by the quantizer 19. It is noted that the noise shaper involves no correction of the non-linearities which exist in the pulse code modulation to pulse width modulation conversion.

Previously, noise shaping comprised finding the instantaneous quantization error from the quantizer 19 by subtraction of the output of the quantizer from its input. This quantization error is filtered with the noise shaping filter F(z), 21, and is added, 20, to the input of the quantizer. However, the noise shaping filter responds only after a delay of one sample, i.e. it is attempted to correct an error at a given time with a correction signal which is transmitted one sample later.

The noise shaper may be regarded as a feedback system where the error is returned to the input and is subtracted. The feedback branch must therefore contain a delay of at least one sample, since instantaneous feedback is not possible. In other words, the noise shaping filter F(z) with the pulse response f(n) must be causal and specially satisfy the condition:

$$f(n)=0 \text{ for } n<1 \qquad (1)$$

The noise shaping filter must moreover give the best possible feedback of the error within the audible frequency range. Such a filter is called a predictor, as the filter tries to predict the error at the following sampling time. A good noise shaping filter is thus a predictive approximation where $F(z) \equiv 1$ within the audible range. Appendix B shows examples of predictive approximation.

The mode of operation of a noise shaper means that the input signal receives some spectrally shaped quantization noise which is suppressed in the audible frequency range at the expense of an increased amount of noise in the ultrasonic range. Unfortunately, the added noise, because of interaction with the following non-linear UPWM conversion, will form so-called intermodulation noise (IM noise) which will increase the noise in the audible range.

Figure 10:
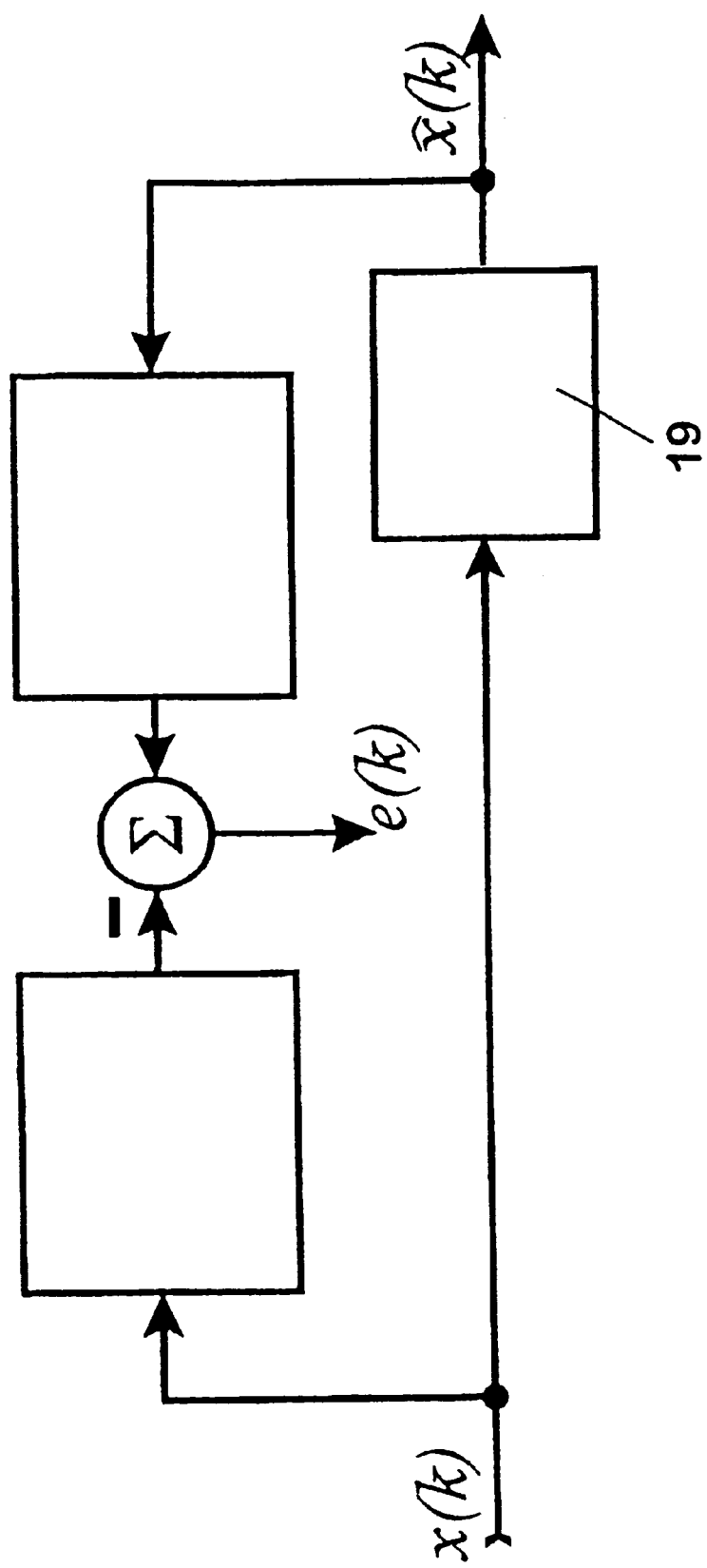
FIG. 10 shows a model for the creation of intermodulation noise.

The IM noise may be defined as the additional noise contribution which is caused by the insertion of a noise shaper just before the UPWM process. If both the input and the output of the noise shaper are separately transmitted through a UPWM model and then subtracted, an error signal representing the IM noise will be isolated. This is illustrated in FIG. 10 where the two Hammerstein UPWM models correspond to FIG. 6.

However, the error signal e(k), which represents the IM noise, cannot readily be fed back because the UPWM models are generally acausal. It is necessary that the feedback branch contains a delay of at least one sample like the noise shaper (condition (1)).

Figure 11:
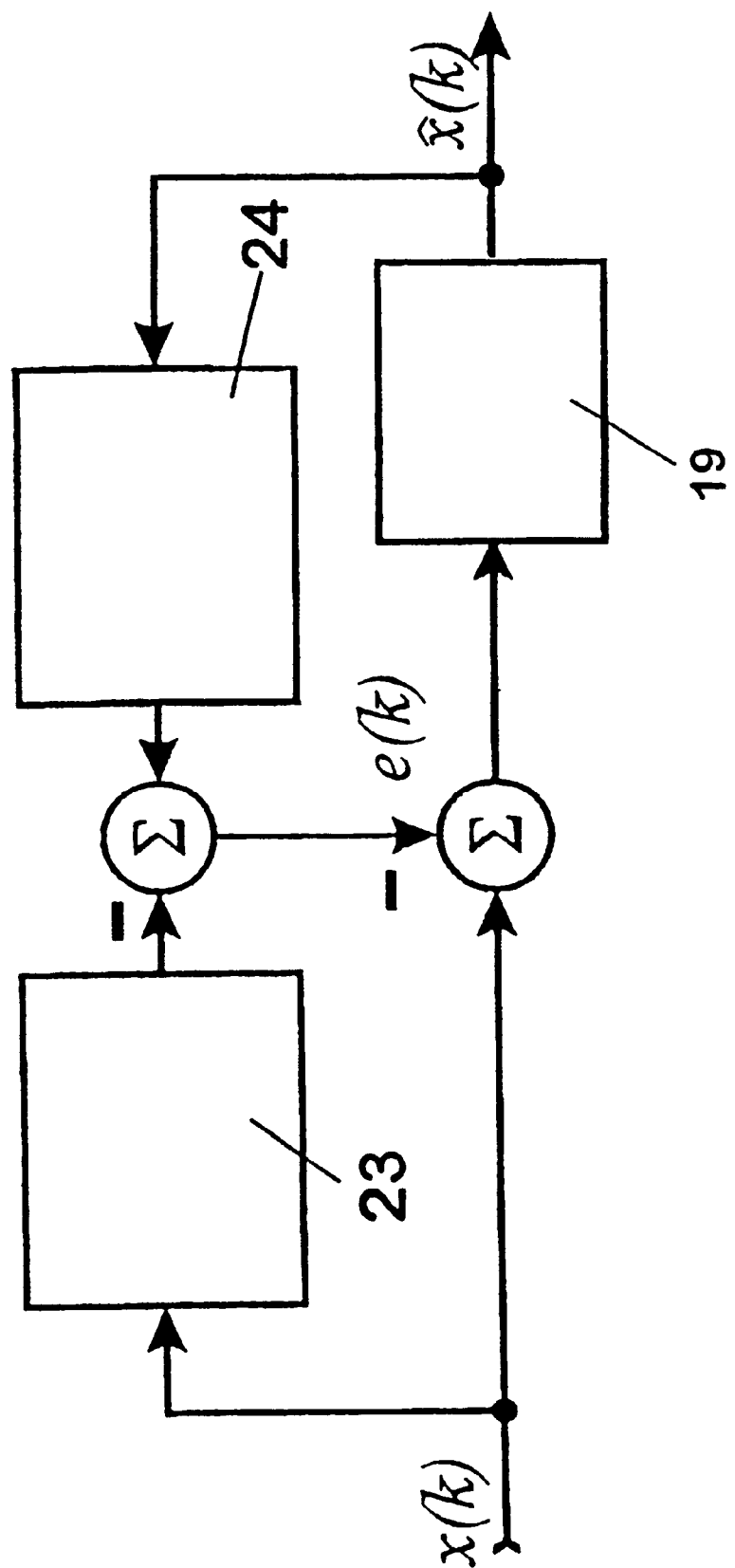
FIG. 11 shows the principles for an intermodulation correction circuit for a noise shaper.

FIG. 11 shows a system for the feedback of IM noise in which the shown Hammerstein UPWM models 23 and 24 are based on predictive LTI filters, and in which the predicted error signal is subtracted at the input of the noise shaper 19. Suppression of the IM noise is hereby achieved by means of feedback.

If both predictive models are the same, then, advantageously, the predicted IM noise signal does not contain signal related components, but only the pure IM noise (the signal related components pass the noise shaper unchanged and thus give no contribution). The system will neither add nor remove harmonic distortion, but just suppress the IM noise concerned. This advantageously permits simultaneous use of feedback correction followed by a noise shaper with IM correction. Owing to the stability of the system fed back, it is an advantage that as most correction as possible takes place in a feedforward circuit.

Figure 12:
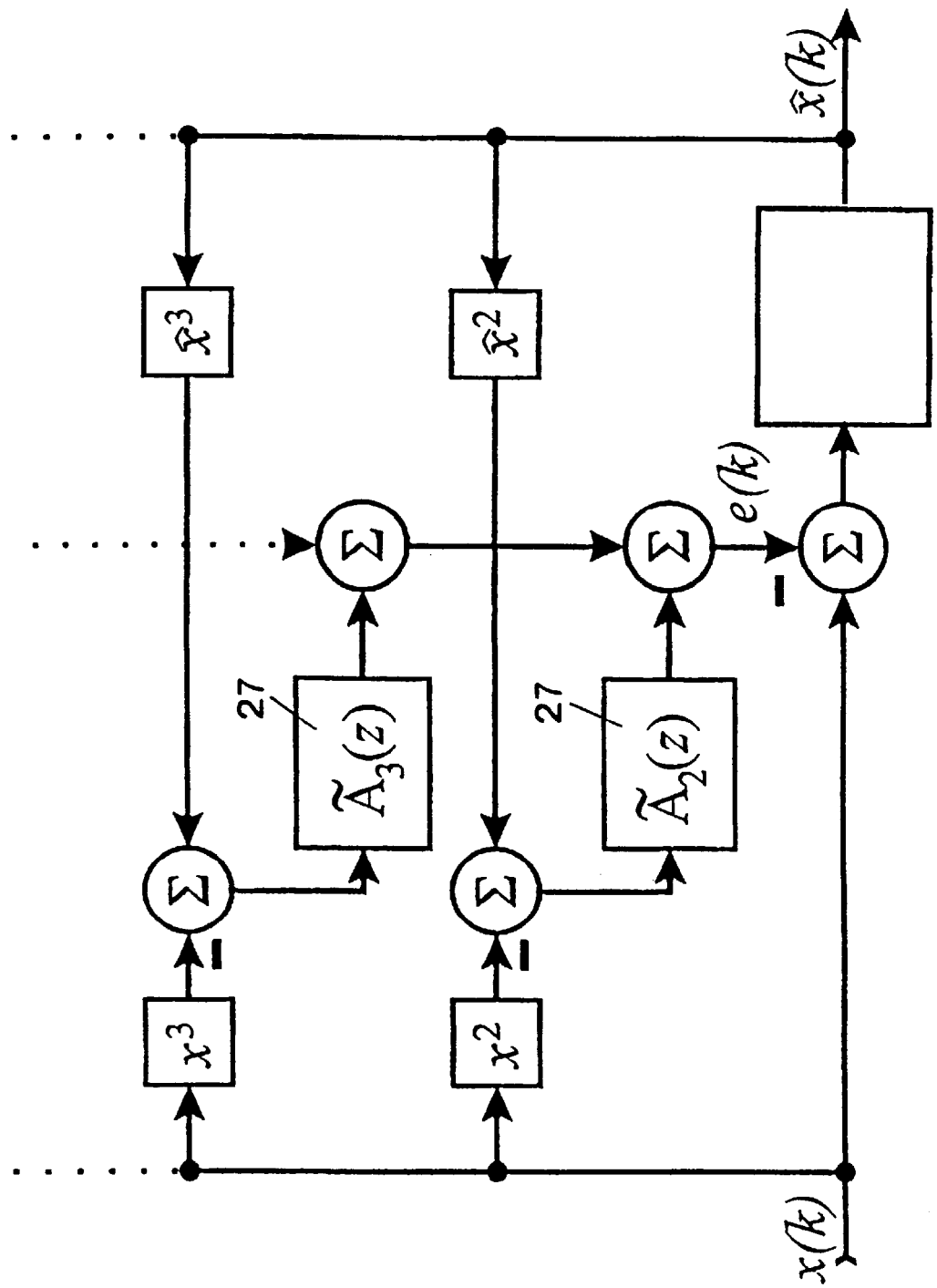
FIG. 12 shows a realizable circuit for the correction of intermodulation noise.

The structure of the predictive models for the UPWM process permits FIG. 11 to be simplified, as the linear, time invariant signal processing (LTI) in both models may be combined. The system is hereby simplified, as shown in FIG. 12 where the LTI blocks 27 are predictive approximations to the transfer functions $A_1(\omega)$ corresponding to the modulation form used (see (m), (n) and (r) in Appendix A). This should be taken to mean that the approximation of the predictors $\hat{A}_1(z)$ is optimized with respect to the audible frequency range, and that $\hat{A}_1(z)$ contains a delay of at least one sample analogous with condition (1). The feedback thus does not become operative until the next sampling time. Appendix B shows examples of such predictive approximations.

It is noted that the linear branches (for l=1) in the predictive UPWM models in FIG. 12 are removed, since these do not contribute to the IM noise.

Figure 13:
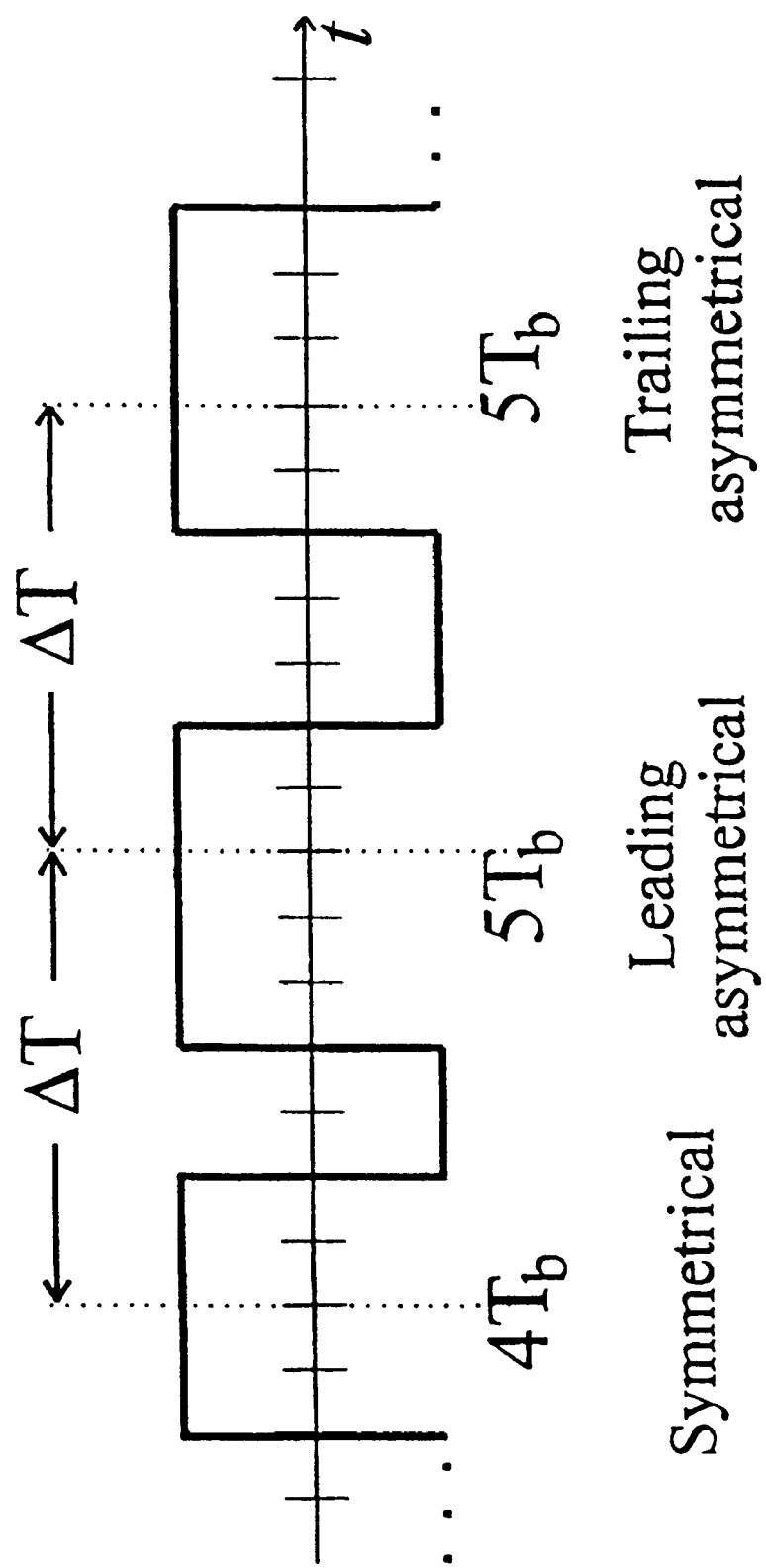
FIG. 13 shows how quasi-symmetrical noise occurs.

As mentioned before, the use of double-sided symmetrical UPWM requires the double bit clock frequency with respect to single-sided modulation. As a result of this circumstance it is has been proposed to use so-called quasi-symmetrical modulation where the bit clock frequency is not doubled. FIG. 13 shows an example of the formation of quasi-symmetrical UPWM. Pulses having a width of an even number of bit clock periods can be formed symmetrically, while pulses having an odd length can only be placed asymmetrically. As shown in FIG. 13, either leading edge asymmetry or trailing edge asymmetry may be involved here.

It may readily be seen from FIG. 13 that if the odd pulses with leading edge or trailing edge asymmetry are shifted half a bit clock period temporally forwards or rearwards, respectively, then the error with respect to symmetrical modulation will be eliminated.

Thus, by quasi-symmetry, the error signal may be expressed as the error by shifting a pulse half a bit clock period.

To make a model of the error in quasi-symmetrical UPWM, first the auxiliary quantity s indicating the form of asymmetry is defined:

$$s = \begin{cases} 1, & \text{for leading edge asymmetry} \\ 0, & \text{for symmetrical pulse} \\ -1, & \text{for trailing edge asymmetri} \end{cases} \quad (2)$$

In other words, the quantity s indicates the time shift of the pulses expressed in half bit clock periods, i.e. the time shift is $s \cdot T_b/2$.

The difference between a time shifted and a non time shifted signal may be expressed by the following transfer function:

$$C_3(\omega) = \left(e^{j\omega \frac{s \cdot T_b}{2\Delta T}} - 1\right) \approx s \cdot j\omega \frac{T_b}{2\Delta T} \quad (3)$$

i.e. a first order differentiator. In other words, the error spectrum is proportional to the frequency.

An equivalent error signal e(k) may now (cf. FIG. 14) be modelled in that a generator sequence g(k) is filtered by a linear filter. The absolute size of the error signal is directly proportional to the duration of the pulse, as time shift of a long pulse gives rise to greater errors than a short duration of the pulse. The generator sequence g(k) must therefore be proportional to the duration of the resulting pulse in case of asymmetry and otherwise zero. The signal x(k)+1 has this property. Furthermore, the sign of the generator sequence may indicate which form of asymmetry the resulting pulse has. The generator sequence g(k) is defined hereby:

$$g(k)=s(k)(x(k)+1) \quad (4)$$

where the signal s(k), originating from the pulse width modulator generator 15, dynamically indicates the form of asymmetry (the time shift) sample by sample.

Figure 14:
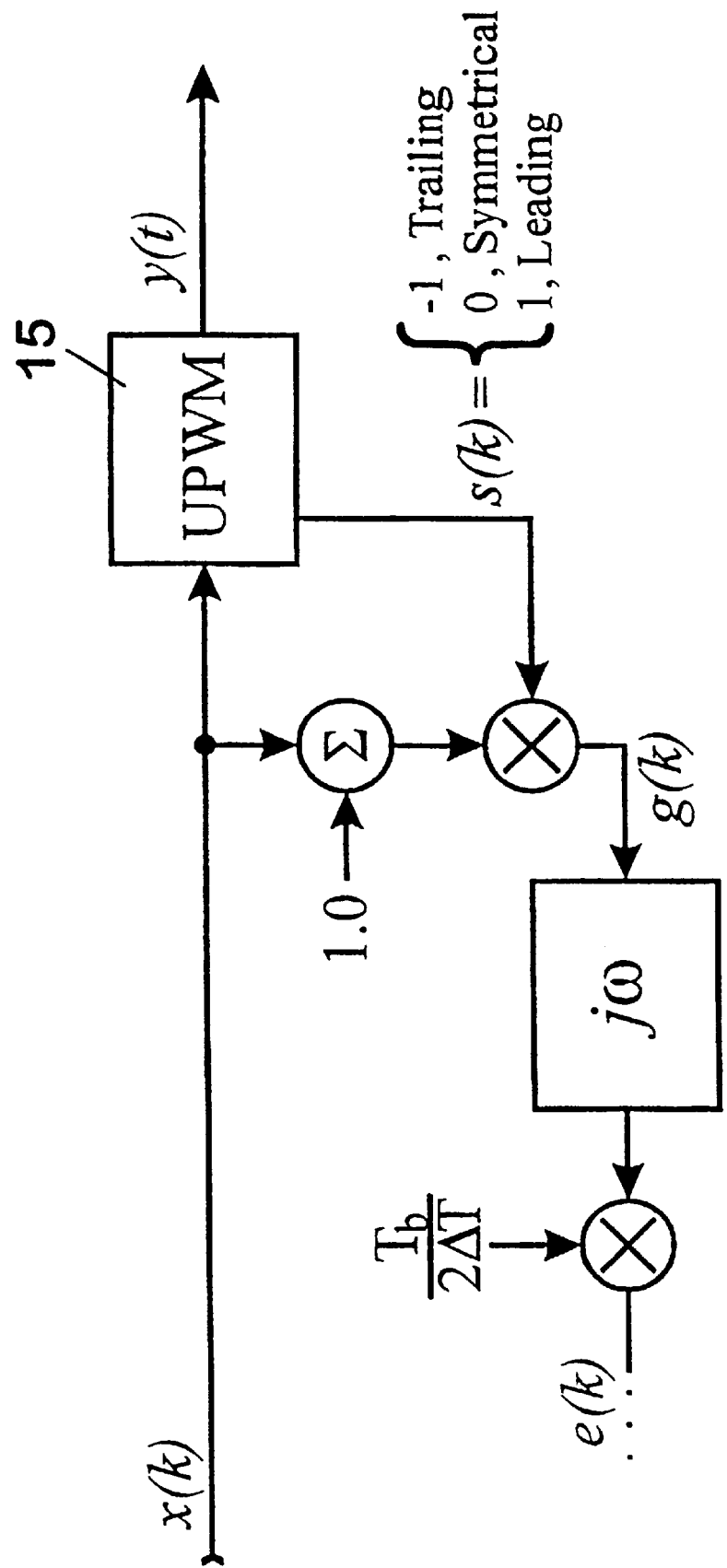
FIG. 14 shows a circuit for the feedback correction of quasi-symmetrical noise.

The error signal e(k) is formed as shown in FIG. 14 by filtering of the generator sequence g(k) with a differentiator filter having the following LTI transfer function which is derived from (3):

$$C(\omega) = j\omega \frac{T_b}{2\Delta T} \quad (5)$$

where $T_b$ is the cycle time of the bit clock and $\Delta T$ is the sampling time.

The dependence of the symmetry form s(k) has shifted from the transfer function (3) to the generator sequence (4). It may hereby be realized that the error model, cf. FIG. 14, is a Hammerstein model, as the differentiator filter 14 shown in FIG. 14 is LTI, and the generator sequence is formed by memoryless non-linear processing of x(k). The constant $T_b/(2\Delta T)$ scales the error e(k) depending on the time resolution given by the bit clock.

The modelled error signal e(k) will thus be the additive error contribution which differs quasi-symmetrically from fully symmetrical UPWM. The error signal is in the form of noise with a spectrum proportional to the frequency because of the transfer function $j\omega$.

For the error model in FIG. 14 to be used for feedback and thus suppression of the quasi-symmetry noise, it is necessary that the $j\omega$ LTI filter is replaced by a predictive approximation. Reference is again made to Appendix B for predictive approximations.

Figure 15:
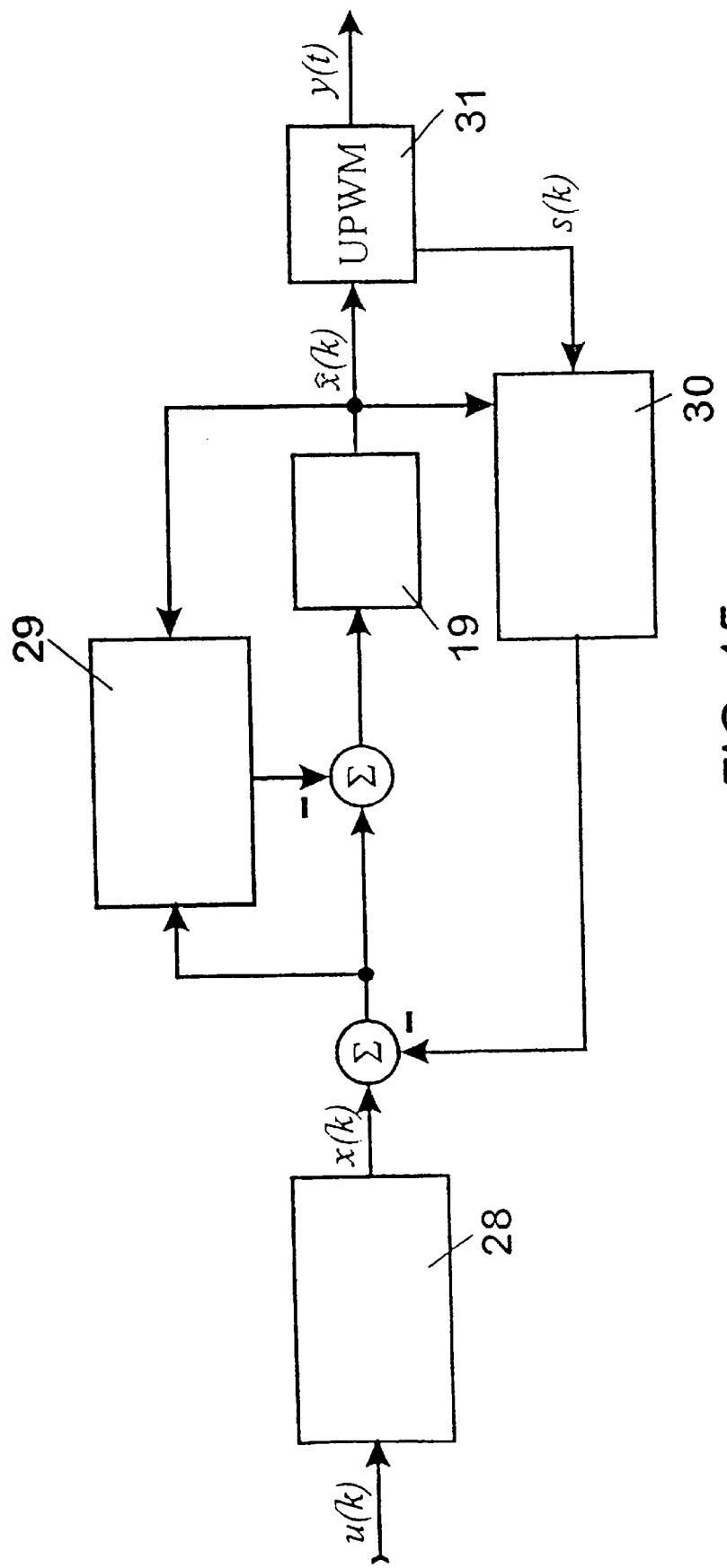
FIG. 15 shows a block diagram for a complete system for PCM to UPWM conversion.

FIG. 15 shows a block diagram of how the various types of correction circuits, which are explained in the foregoing, may be combined to a complete pulse code modulation to pulse width modulation system. In FIG. 15, u(k) represents an oversampled audio signal which is fed to a feed-forward equalizing unit 28, cf. FIG. 8. Then the amplitude discretized signal is formed by a noise shaper 19 which is provided with feedback correction for both IM noise in the circuit 29 and quasi-symmetrical noise in the circuit 30. The pulse width modulation unit 31 then converts to a pulse width modulated signal y(t) which switches synchronously with the bit clock with the frequency $f_b$.

It is noted in this case that it is not necessary in all cases to use all correction blocks in FIG. 15.

If quasi-symmetrical pulse width modulation, as explained in connection with FIG. 13, is not used, the correction in the circuit 30 must be omitted. In some cases, even the IM correction in the circuit 29 may turn out to be superfluous and may thus be omitted.

Figure 16:
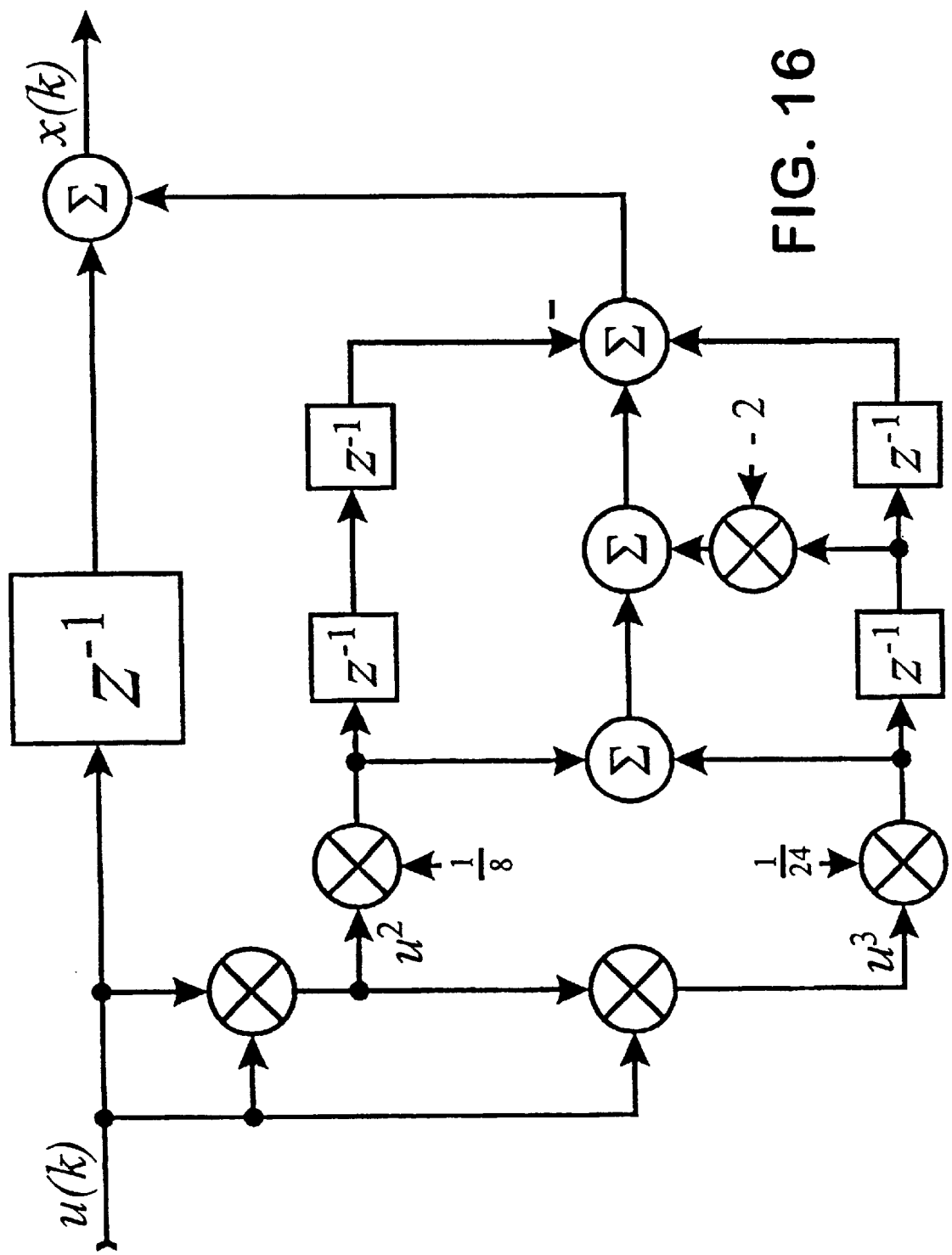
FIG. 16 shows a first embodiment of a feedforward circuit according to the invention.

FIG. 16 shows a practical implementation of the feedforward correction circuit of FIG. 8 for the correction of single-sided trailing edge modulation. A total delay of K=1 samples ($B_1(z)=z^{-1}$) is selected, and only correction up to and including 3rd order is included. From equation (H) in Appendix C and (m) in Appendix A:

$$B_2(\omega)=-A_2(\omega))=j\omega/4$$

Hence, the following approximation by means of Table 2 in Appendix B for $G(\omega)=j\omega$ and K=1:

$$B_2(z) \approx \frac{1}{4}(\frac{1}{2}-\frac{1}{2}z^{-2})=(1-z^{-2})/8$$

Hence, from equation (m) in Appendix A and equation (L) in Appendix C:

$$B_3((\omega)) = A_3(\omega)) = -\omega^2/24$$

Hence, the following approximation by means of Table 2 for $G(\omega)) = -\omega^2$ and $K=1$:

$$B_3(z) \approx (1 - 2z^{-1} + z^{-2})/24$$

As will be seen from the expressions of $B_2(z)$ and $B_3(z)$, these filters may be implemented by means of multipliers, summations and time delays, which appears from FIG. 16.

Figure 17:
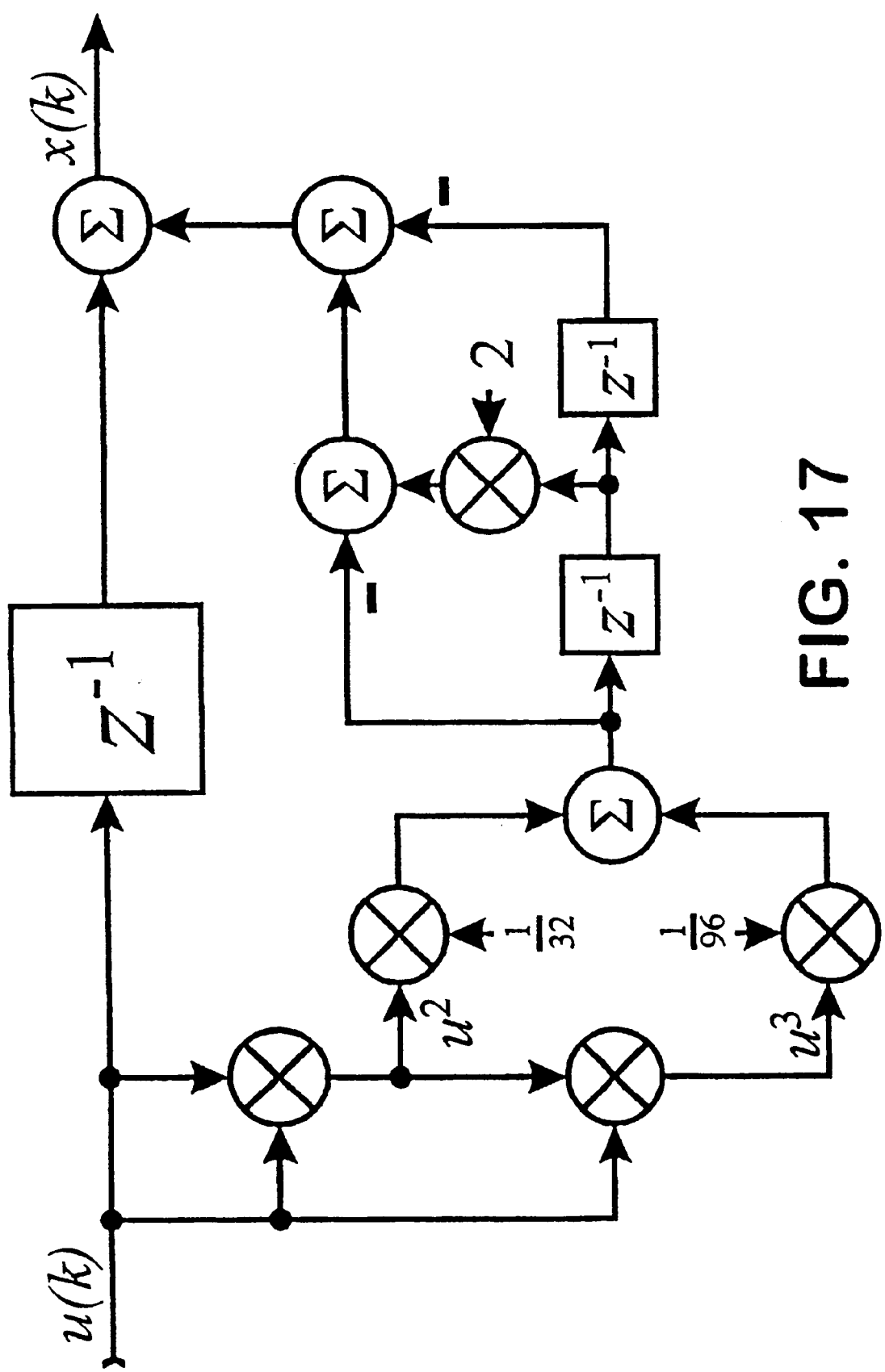
FIG. 17 shows a second embodiment of a feedforward circuit according to the invention.
Figure 18:
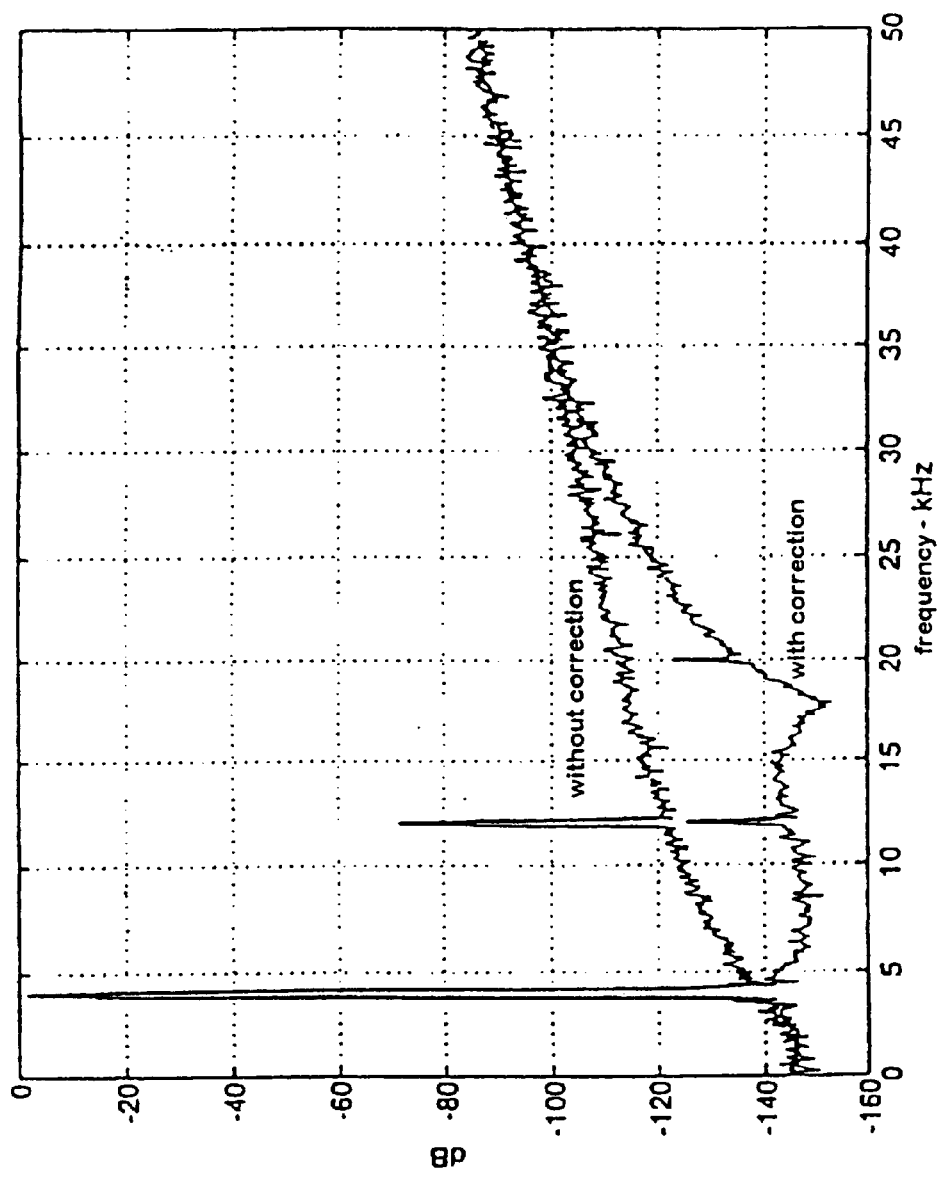
FIG. 18 shows the effect of the correction circuits of the invention.
Figure 19:
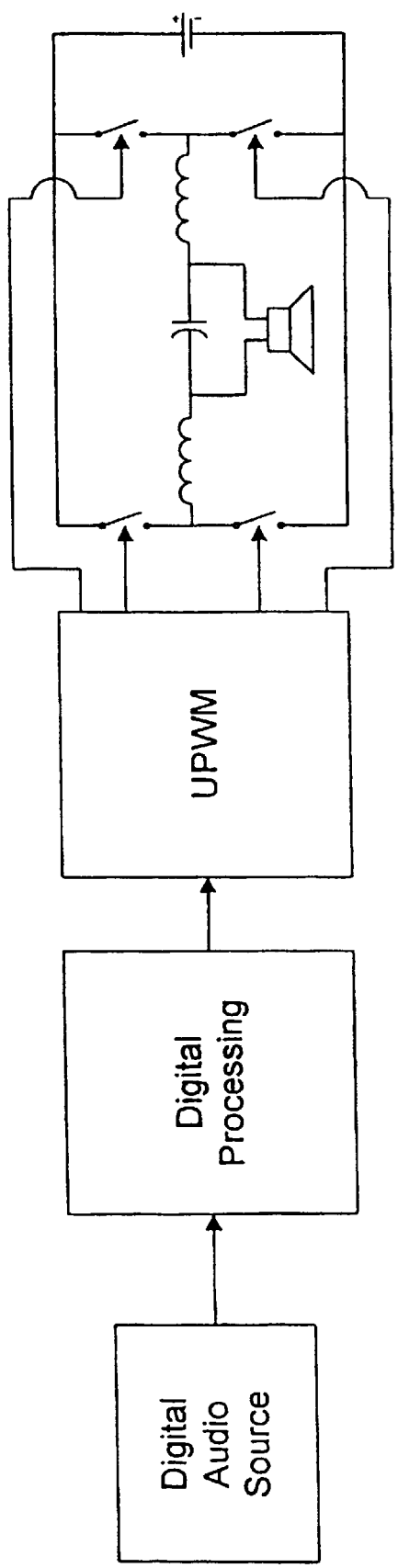
FIG. 19 shows a digital amplifier according to the invention with a connected class D output stage.

FIG. 17 shows an embodiment of the feedforward circuit which is intended to correct double-sided symmetrical modulation up to and including 3rd order and for K=1. In this case, it may be turned to account that the second and third order contributions may approximately use the same filter, cf. formulae (O) and (P) in Appendix C. This results in the extremely simple structure for the implementation of the feedforward circuit of the invention shown in FIG. 17.

The calculation principles in the embodiment of FIG. 17 are the same as in the embodiment of FIG. 16 and will therefore not be described in more detail.

Appendix A

Various UPWM forms are described below. Furthermore, the Taylor development of the equivalent signal y(k) from FIG. 5 is shown, which leads to the determination of the transfer functions in FIG. 6.

Mathematically, the UPWM modulation may be characterized by a function p(x(k),t), which indicates a pulse course of the duration $\Delta T$ as a function of the sample x(k). The modulated signal y(t) may hereby be formulated as an infinite sum of time shifted pulses:

$$y(t) = \sum_k p(x(k)_2 t - k\Delta T) \tag{a}$$

Generally, a distinction is made between class AD and class BD modulation. In class AD modulation, y(t) can only assume the amplitude 1 or −1, while in class BD modulation y(t) can assume the amplitude 1, 0 or −1. Furthermore, a distinction is made between double-sided and single-sided modulation. There are two variants for single-sided modulation: leading edge modulation and trailing edge modulation depending on which pulse flank is modulated. The following figures, cf. page 29, show p(x,t) for the three classes of AD modulation:

FIG. A1: leading edge formulation
FIG. A2: trailing edge modulation
FIG. A3: double-sided symmetrical modulation Class BD modulation may be described as a type of differential coupling of two class AD modulations:

$$p_{BD}(x,t) = (p_{AD}(x,t) - p_{AD}(-x,t))/2 \tag{b}$$

This results in a pulse signal capable of assuming the values −1, 0 and 1.

From FIG. 5, by convolution of y(t) with h(t):

$$\tilde{y}(t) = h(t) * y(t) = \int_{-\infty}^{\infty} y(t-\tau)h(\tau)d\tau \tag{c}$$

The discrete-time signal y(k) is then given by sampling with the sampling time interval $\Delta T$:

$$y(k) = \tilde{y}(k\Delta T) \tag{d}$$

The convolution integral may be split into contributions of the duration $\Delta T = 1$:

$$y(k) = \sum_i \int_{(i-\frac{1}{2})\Delta T}^{(i+\frac{1}{2})\Delta T} y(k\Delta T - \tau)h(\tau)d\tau \tag{e}$$

$$= \sum_i \int_{-\frac{1}{2}\Delta T}^{\frac{1}{2}\Delta T} p(x(k-i), -\tau)h(\tau + i\Delta T)d\tau$$

It will be seen from this that y(k) may be expressed as a sum of generally non-linear functions of time shifted samples of x(k):

$$y(k) = \sum_i \hat{h}_i\{x(k-i)\} \tag{f}$$

A Taylor development of this infinity of non-linearities is now performed from the zero signal x(k)=0 (i.e. a McLaurin's series). The non-linearities are hereby split into a double infinity of polynomial contributions:

$$y(k) = \sum_i \sum_{l>0} a_{il} x^l(k-i) \tag{g}$$

where the Taylor coefficients $a_{il}$ are given by the lth derived ones of the non-linearities:

$$a_{il} = \frac{1}{l!} \hat{h}_i^{(l)}\{x=0\} \tag{h}$$

This Taylor's series may now be expressed (by sorting the terms according to time and power) as a signal model in which each power of the input signal, $x^l(k)$, is filtered by linear and time invariant (LTI) discrete-time filters $A_l(z)$ given by the coefficients $a_{il}$ as a pulse response:

$$A_l(z) = \sum_i a_{il} z^i, \quad \text{where } z = e^{j\omega} \tag{i}$$

For single-sided class AD trailing edge modulation (by means of FIG. A2):

$$\hat{h}_i\{x\} = \int_{-\frac{1}{2}\Delta T}^{\frac{1}{2}\Delta T} p(x-\tau)h(\tau + i\Delta T)d\tau \tag{j}$$

$$= -\int_{-\frac{1}{2}\Delta T}^{-\frac{1}{2}x\Delta T} h(\tau + i\Delta T)d\tau + \int_{-\frac{1}{2}x\Delta T}^{\frac{1}{2}\Delta T} h(\tau + i\Delta T)d\tau$$

Hence, by differentiation:

$$\hat{h}'_i\{x\} = h(i\Delta T - \tfrac{1}{2}x\Delta T) \tag{k}$$

Continued differentiation generally provides the following coefficient set of formula (h) (with $\Delta T=1$):

$$a_{il} = \frac{1}{l!} \hat{h}_i^{(l)}\{x=0\} = \frac{1}{l!}\left(\frac{-1}{2}\right)^l h^{(l-1)}(i\Delta T) \tag{l}$$

This means that the filter coefficients are based on a sampling of the (l−1)th derived one of the pulse response h(t), which, as mentioned before, is an ideal lowpass filter having the cut-off frequency $f_g = f_s/2$. The following transfer functions may hereby be derived directly, with $A_1(\omega)$ set at 1:

$$A_l(\omega) = \frac{1}{l!}\left(\frac{-j\omega}{2}\right)^{(l-1)} \quad \text{(m)}$$

Analogously, it may be inferred by symmetry consideration that for single-sided class AD leading edge modulation:

$$A_l(\omega) = \frac{1}{l!}\left(\frac{j\omega}{2}\right)^{(l-1)} \quad \text{(n)}$$

As will be seen, leading edge modulation is just as non-linear as trailing edge modulation, but the even distortion components have an opposite sign.

For double-sided symmetrical class AD modulation (FIG. A3):

$$\hat{h}_i\{x\} = -\int_{-\frac{1}{2}\Delta T}^{-\frac{1}{2}(x+1)\Delta T} h(\tau + i\Delta T) d\tau + \quad \text{(o)}$$

$$\int_{-\frac{1}{4}(x+1)\Delta T}^{\frac{1}{4}(x+1)\Delta T} h(\tau + i\Delta T) d\tau - \int_{\frac{1}{4}(x+1)\Delta T}^{\frac{1}{2}\Delta T} h(\tau + i\Delta T) d\tau$$

Hence the following coefficients in the Taylor's series:

$$a_{il} = \frac{1}{l!}\hat{h}_i^{(l)}\{x=0\} = \quad \text{(p)}$$

$$\frac{1}{l!}\frac{1}{2}\left[\left(\frac{-1}{4}\right)^l h^{(l-1)}\left(\left(i-\frac{1}{4}\right)\Delta T\right) + \left(\frac{1}{4}\right)^l h^{(l-1)}\left(\left(i+\frac{1}{4}\right)\Delta T\right)\right]$$

As will be seen, two time shifted samplings of derived ones of h(t) are included. Hence, in the frequency domain, the following transfer functions:

$$A_l(\omega) = \frac{1}{2(l!)}\left\{\exp\left(\frac{j\omega\Delta T}{4}\right)\left(\frac{j\omega}{4}\right)^{(l-1)} + \exp\left(\frac{-j\omega\Delta T}{4}\right)\left(\frac{-j\omega}{4}\right)^{(l-1)}\right\} \quad \text{(q)}$$

This expression may be approximated with the following somewhat simpler expression:

$$A_1(\omega) \approx \begin{cases} \frac{1}{1!}\left(\frac{j\omega}{4}\right)^{(l-1)}, & \text{for odd } l \\ \frac{1}{1!}\left(\frac{j\omega}{4}\right)^l, & \text{for even } l \end{cases} \quad \text{(r)}$$

It will thus be seen that double-sided symmetrical UPWM is considerably more linear than single-sided symmetrical UPWM. The level generally decreases by a factor of 4 (in contrast to 2 for single-sided symmetrical UPWM) each time the distortion order l increases by 1. Further, the even distortion products increase by the 1st power of the frequency in contrast to the (l−1)th power for single-sided symmetrical UWM.

Figure 20A:
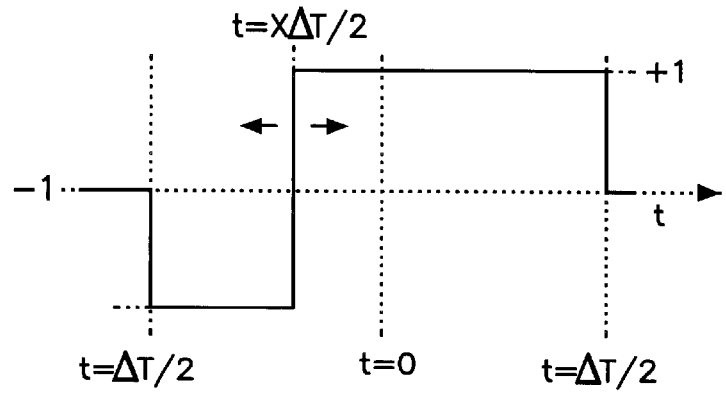
FIGS. 20A, B, and C show p(x,t) for the three classes of AD modulation: (leading edge formulation, trailing edge formulation, and double-sided symmetrical modulation).
Figure 20B:
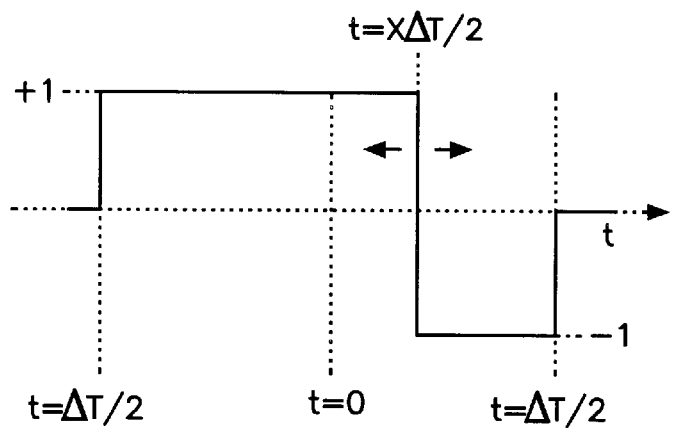
Figure 20C:
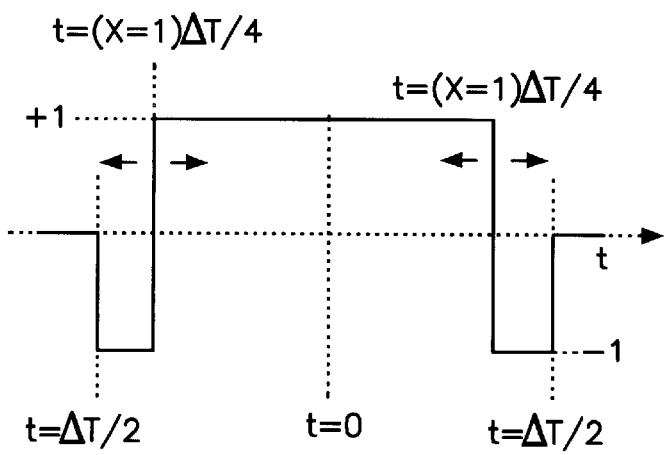

For class BD modulation, the distortion components of even order will not be included because of the differential coupling. In this case, $A_l(\omega)=0$ for even l. Class BD is thus considerably more linear than corresponding class AD modulation. FIGS. 20A, B, and C show p(x,t) for the three classes of AD modulation, including the leading edge formulation (FIG. 20A), trailing edge formulation (FIG. 20B), and double-sided symmetrical formulation (FIG. 20C).

Appendix B

Examples of filter approximations for use in feedforward and feedback are shown below. Filter approximation may be defined as the task of finding a realizable filter structure with an associated (finite) set of coefficients so that a given transfer function is approximated as best as possible.

Approximations by means of FIR filter (Finite Impulse Response) are described below. It is pointed out that the invention may also be based on recursive (IIR) filters. Furthermore, the literature includes a large number of other (and better) approximation criteria than shown here (Parks MacLellan, Least Squares, etc.).

FIR PREDICTORS

Here, the following class of FIR filters with N coefficients is selected:

$$C(z) = c_1 z^{-1} + c_2 z^{-2} \ldots + c_N z^{-11} \quad \text{(aa)}$$

This transfer function is causal and responds with a delay of one sample as required for feedback (analogously with (1)). The coefficients $c_1 \ldots c_1$, must now be selected such that a given transfer function is approximated. In this case, the criterion is selected such that the first N derived ones with respect to the frequency ω of the transfer function for the FIR filter (a) must be identical with the corresponding derived ones for the given transfer function. This gives N linear equations with N unknowns, the solution being a FIR predictor with an approximation error proportional to $\omega^{11}$. This means that the approximation is best at low frequencies (corresponding to the audible range when using oversampling). The following table shows the result for N=1 . . . 4, where G(ω)) is the approximated transfer function:

TABLE 1

| G (ω) | N = 1 | N = 2 | N = 3 | N = 4 |
|---|---|---|---|---|
| 1 | $z^{-1}$ | $2z^{-1} - z^{-2}$ | $3z^{-1} - 3z^{-2} + z^{-3}$ | $4z^{-1} - 6z^{-2} + 4z^{-3} - z^{-4}$ |
| jω | 0 | $z^{-1} - z^{-2}$ | $2.5z^{-1} - 4z^{-2} + 1.5 z^{-3}$ | $4\frac{1}{3}z^{-1} - 9\frac{1}{2}z^{-2} + 7z^{-3} - 1\frac{5}{6}z^{-4}$ |
| $-\omega^2$ | 0 | 0 | $z^{-1} - 2z^{-2} + z^{-3}$ | $3z^{-1} - 8z^{-2} + 7z^{-3} - 2z^{-4}$ |

Filters suitable as noise shaping filters (see FIG. 9) are obtained from Table 1 for G(ω)=1. For G(ω)=jω, predictors intended for e.g. feedback of quasi-symmetry noise, cf. FIG. 14, are obtained. The table may moreover be used for determining predictors $\hat{A}_1(z)$ for feedback of IM noise, cf. FIG. 12.

FIR FEEDFORWARD FILTERS

FIR filters of the form:

$$B_1(z) = b_{1,0} + b_{1,1}z^{-1} + b_{1,2}z^{-2} \ldots + b_{1,2K}z^{-2K} \quad \text{(bb)}$$

are selected for use in the feedforward correction.

The filters are causal and have 2K+1 coefficients, which are desirably selected such that that the given transfer function $e^{jK\omega}G(\omega)$ is approximated. This means that G(ω) is approximated by (bb) with a delay of K samples. This results in an approximation error which is considerably smaller than for a predictive approximation with the same number of coefficients.

The use of the same criterion as shown above gives the following table in which the approximation error increases with $\omega^{2K+1}$:

TABLE 2

| G (ω) | K = 1 | K = 2 |
|---|---|---|
| 1 | $z^{-1}$ | $z^{-2}$ |
| jω | $\frac{1}{2} - \frac{1}{2}z^{-2}$ | $-\frac{1}{12} + \frac{2}{3}z^{-1} - \frac{2}{3}z^{-3} + \frac{1}{12}z^{-4}$ |
| $-\omega^2$ | $1 - 2z^{-1} + z^{-2}$ | $-\frac{1}{12} + 1\frac{1}{3}z^{-1} - 2\frac{1}{2}z^{-2} + 1\frac{1}{3}z^{-3} - \frac{1}{12}z^{-4}$ |
| $-j\omega^3$ | 0 | $\frac{1}{2} - z^{-1} + z^{-3} - \frac{1}{2}z^{-4}$ |

Appendix C

Described below is a method for the exact determination of $B_1(z)$ filters for use in the feedforward correction of UPWM taking false components into consideration.

It is contemplated that the feedforward circuit in FIG. 7 is followed by the UPWM model in FIG. 6. It is moreover assumed that the input signal u(k) is a complex pure tone having the frequency ω. Owing to the notation, time index (k) is left out in the following. We now have:

$$u = e^{j\omega k} \quad (A)$$

It is noted that involution generally gives:

$$u^l = e^{jl\omega k} \quad (B)$$

i.e. a complex pure tone having the frequency 1ω.

All terms having a power above 4 are left out in the following calculations for clarity.

The output signal x=x(k) of the feedforward circuit is now given by filtering of the polynomial contributions $u^l$ with $B_1(\omega)$) as well as subsequent summation:

$$x = u + B_2(2\omega)u^2 + B_3(3\omega)u^3 + B_4(4\omega)u^4 + \ldots \quad (C)$$

In the UPWM model, $x^2$, $x^3$ and $x^4$ are formed:

$$x^2 = u^2 + 2B_2(2\omega)u^3 + (B_2^2(2\omega) + 2B_3(3\omega))u^4 + \ldots \quad (D)$$

$$x^3 = u^3 + 3B_2(2\omega)u^4 + \ldots \quad (E)$$

$$x^4 = u^4 + \ldots \quad (F)$$

Filtering of the polynomial contributions $x^l$ with $A_l(\omega)$ and subsequent summation then provide the output signal y(k) of the system (by collection of terms with the same power):

y=u+

$[B_2(2\omega)+A_2(2\omega)]u^2$ $[B_3(3\omega)+2A_3(3\omega)B_2$ $(2\omega)+A_3(3\omega)]u^3+$ $[B_4(4\omega)+A_2(4\omega)(B_2^2$ $(2\omega)+2B_3(3\omega))+$ $A_3(4\omega)3B_2(2\omega)+$ $A_4(4\omega)]u^4$

+ ... (G)

The purpose of the feedforward is to linearize the system, i.e. to satisfy the condition y=u.

It will be seen from (B) that it generally is possible to start directly with $B_2(\omega)$:

$$B_2(\omega) = -A_2(\omega) \quad (H)$$

Then, $B_3(\omega)$ is determined so that the complete 3rd order contribution is eliminated. It is noted from (G) that the 3rd order contribution has a mixed term which is the "false" 3rd order contribution to be included in $B_3(\omega)$:

$$B_3(3\omega) = -2A_2(3\omega)B_2(2\omega) - A_3(3\omega) = 2A_2(3\omega)A_2(2\omega) - A_3(3\omega) \quad (I)$$

Which is tantamount to:

$$B_3(\omega) = 2A_2(\omega)A_2(2\omega/3) - A_3(\omega) \quad (J)$$

This is followed by the determination of $B_4(\omega)$ by means of (G):

$$B_4(4\omega) = -A_2(4\omega)(B_2^2(2\omega) - 2B_3(3\omega)) - A_3(4\omega)3B_2(2\omega) - A_4(4\omega) \quad (K)$$

Three false 4th order contributions are thus involved here. By continued substitution:

$$B_4(\omega) = -A_2(\omega)[A_2^2(\omega/2) + 4A_2(3\omega/4)A_2(\omega/2) - 2A_3(3\omega/4)] + 3A_3(\omega)A_2(\omega/2) - A_4(\omega) \quad (Ka)$$

When including more terms, $B_5(\omega)$, $B_6(\omega)$ ... may be determined. However, the process rapidly becomes complicated in terms of calculation, because the number of false components increases strongly. It is rarely necessary, however, to include corrections for more than the 4th order contribution since these have a very small amplitude.

The preceding calculations have been based on the assumption that the linear branches have the transfer functions 1 both in feedforward and in UPWM model, i.e. coupled directly without any filter. If a delay of K samples is introduced in the linear branch of the feedforward, as shown in FIG. 8, all $B_1\omega$) transfer functions for l>1 must be corrected by a corresponding delay with the transfer function $e^{-jK\omega} = z^{-K}$. As described in Appendix B, it is hereby easier to approximate the realizable (causal) filters in the feedforward.

EXAMPLE

For example, for single-sided trailing edge modulation of (J) and (m) in Appendix A:

$$B_3(\omega) = 2 \cdot \frac{1}{4}j\omega \cdot \frac{1}{4}\frac{2}{3}j\omega + \frac{1}{24}\omega^2 = -\frac{1}{24}\omega^2 = A_3(\omega) \quad (L)$$

As will be seen, the false 3rd order contribution is twice as great and oppositely directed $A_3(\omega)$, making it necessary to reverse the sign of $B_3(\omega)$ From (K) and (m) by careful calculation:

$$B_4(\omega) = -A_4(\omega) \quad (M)$$

Further, a careful calculation of (K) with the 5th order terms shows that:

$$B_5(\omega) = A_5(\omega) \quad (N)$$

Therefore, it seems to apply generally that the sign must be reversed for the odd filters in the case of single-sided trailing edge modulation.

EXAMPLE

For double-sided symmetrical modulation, from (r) in Appendix A and (H):

$$B_2(\omega) = -A_2(\omega) = \omega^2/32 \quad (O)$$

And:

$$B_3(\omega)) = \omega^2/96 + \omega^4/1152 = -A_3(\omega) + \omega^4/1152 \quad (P)$$

Here, in a practical implementation, it may be decided to disregard the $\omega^4$ term (the false contribution), since the amplitude is very limited. Both $B_2(\omega)$ and $B_3((\omega)$ may hereby be based on a common filter with the transfer function $\omega^2$ which is fed to the signal $u^2/32 + u^3/96$. This recipe is used in the implementation of the circuit in FIG. 17.

What is claimed is:

1. A signal converter for converting a PCM input signal into a UPWM output signal, the signal converter comprising:
   a UPWM converter that receives a UPWM converter input signal and generates the UPWM output signal in the form of output pulses of variable widths based on the UPWM converter input signal,
   a first set of correction signal paths that receives the PCM signal and generates a first set of respective correction signals,
   each correction signal path of the first set of correction signal paths comprising a non-linear generator function in series with a linear correction filter,
   a summing unit that combines the first set of respective correction signals with a linearly filtered first PCM signal to provide an error-corrected PCM signal,
   the first set of correction signal paths comprising at least one correction signal path,
   the error-corrected PCM signal suppressing at least one of non-linearity and noise generation within the signal converter caused by conversion of the PCM input signal into the UPWM output signal.

2. A signal converter according to claim 1, further comprising:
   a second set of correction signal paths that receives a second PCM signal and generates a second set of respective correction signals,
   each correction signal path of the second set of correction signal paths comprising a non-linear generator function in series with a linear correction filter,
   the second set of correction signal paths comprising at least one correction signal path.

3. A signal converter according to claim 2, wherein the summing unit combines the first set of respective correction signals and the second set of respective correction signals with the first PCM signal to provide the error-corrected PCM signal.

4. A signal converter according to claim 2, wherein each correction signal path of the first set of correction signal paths forms part of a respective feed-forward loop within the signal converter, and
   each correction signal path of the second set of correction signal paths forms part of a respective feed-back loop within the signal converter,
   the summing unit combining the first and second sets of correction signals with the first PCM signal to provide the error-corrected PCM signal.

5. A signal converter according to claim 4, further comprising:
   a noise shaping signal path that receives the PCM signal, and wherein the summing unit is arranged in series with a noise shaper to provide a quantized and noise-shaped PCM signal,
   the first set of respective correction signals being fed-forward to the summing unit and the second PCM signal being constituted by the quantized and noise-shaped PCM signal so that the second set of respective correction signals is fed-back to the summing unit,
   whereby the error-corrected PCM signal provided by the summing unit is applied to the input of the noise shaper to suppress intermodulation noise in the UPWM output signal due to the non-linear UPWM conversion process being applied to the noise shaper output signal.

6. A signal converter according to claim 1, wherein each correction signal path of the first set of correction signal paths forms part of a respective feed-forward loop within the signal converter,
   the first set of respective correction signals thereby correcting earlier occurring signal samples of the first PCM signal.

7. A signal converter according to claim 6, further comprising:
   a linear signal path that receives the PCM signal and generates the first PCM signal in response to the PCM signal,
   thereby forming the error-corrected PCM signal by combining the first PCM signal generated by the linear signal path and the first set of respective correction signals in the summing unit.

8. A signal converter according to claim 7, wherein the PCM signal is constituted by the PCM input signal of the signal converter or an associated PCM signal derived from the PCM input signal,
   the first set of correction signal paths and the linear signal path thereby forming a feed-forward structure that generates the error-corrected PCM signal.

9. A signal converter according to claim 7, wherein the linear signal path comprises a time delay having a time delay of K samples, K being a positive integer number,
   the time delay of one sample being the reciprocal of a sampling frequency of the first PCM signal.

10. A signal converter according to claim 9, wherein each of the linear correction filters of the first set of correction paths provides a time delay of substantially K samples in the respective correction signal.

11. A signal converter according to claim 7, wherein the error-corrected PCM signal from the summing unit is applied to a noise shaper, the noise shaper generating a quantized and noise-shaped PCM signal in response to the error-corrected PCM signal.

12. A signal converter according to claim 11, wherein the UPWM converter receives the quantized and noise-shaped PCM signal of the noise shaper.

13. A signal converter according to claim 12, further comprising:
   a third set of correction signal paths that receives a third PCM signal and generates a third set of respective correction signals,
   each correction signal path of the third set of correction signal paths comprising a non-linear generator function in series with a linear correction filter,
   the third set of correction signal paths comprising one or several correction signal paths,
   a second summing unit arranged in series with the noise shaper that combines the second set of respective correction signals and the third set of respective correction signals to provide a second error corrected PCM signal,
   the second set of correction signal paths receiving the error-corrected PCM signal to generate the second set of respective correction signals,
   the noise-shaped PCM signal of the noise shaper being applied to the third set of correction signal paths to generate the third set of respective correction signals.

14. A signal converter according to claim 13, further comprising:
   a quasi-symmetrical UPWM converter generating the UPWM output signal in the form of symmetrical and asymmetrical output pulses of variable widths in response to a fourth PCM signal, a fourth set of correction signal paths that receives the fourth PCM signal and generates a fourth set of respective correction signals, each correction signal path of the fourth set comprising a non-linear generator function in series with a linear correction filter, the fourth set of correction signal paths comprising at least one correction signal path having a non-linear generator function that provides a generator signal in response to a dynamic indication of a symmetry form of the symmetrical and asymmetrical output pulses to provide the fourth set of respective correction signals, a third summing unit that combines the fourth set of respective correction signals and the error-corrected PCM signal to provide a third error-corrected PCM signal, the third summing unit providing the third error-corrected PCM signal to the input of the second summing unit.

15. A signal converter according to claim 7, wherein the first set of correction signal paths comprises n correction signal paths, each comprising a respective linear correction filter and an associated polynomial non-linearity of order (n+1), n being a positive integer and correction filter index, so as to form the feed-forward circuit structure with a total of n of polynomial non-linearities of increasing order in respective correction signal paths.

16. A signal converter according to claim 1, wherein each correction signal path of the first set of correction signal paths forms part of a respective feed-back loop within the signal converter, the first set of respective correction signals thereby correcting later occurring signal samples of the first PCM signal.

17. A signal converter according to claim 16, wherein the UPWM converter comprises a quasi-symmetrical UPWM converter generating the UPWM output signal in the form of symmetrical and asymmetrical output pulses of variable widths in response to the PCM signal, the first set of correction signal paths comprising at least one correction signal path with a non-linear generator function that provides a generator signal in response to a dynamic indication of a symmetry form of the symmetrical and asymmetrical output pulses to provide the first set of respective correction signals, thereby forming the error-corrected PCM signal by feedback of the first set of respective correction signals from the input of the quasi-symmetrical UPWM converter to the summing unit so as to suppress an inherent non-linearity of the quasi-symmetrical UPWM converter.

18. A signal converter according to claim 17, further comprising:

a noise shaper that receives the error-corrected PCM signal from the summing unit and generates a quantized and noise-shaped PCM signal in response to the error-corrected PCM signal, and wherein the quantized and noise-shaped PCM signal constitutes the PCM signal fed to the input of the quasi-symmetrical UPWM converter.

19. A signal converter according to claim 17, wherein the at least one correction signal path that provides the generator signal comprises a scaling function that multiplies the generator signal with a constant of:

$$K_{scale} = \frac{T_b}{2\Delta T},$$

wherein $T_b$ is the cycle time of the bit clock $\Delta T$ represents a cycle time of the UPWM signal.

20. A signal converter according to claim 19, wherein the generator signal g(k) is given by:

$$g(k)=s(k)(x(k)+1)$$

where the quantity $\Delta T^*(x(k)+1)/2$ represents a width of the output pulse of the UPWM output signal at time index k, s(k) is the signal providing the dynamic indication of the symmetry form of the variable width output pulse and represents a time shift with respect to symmetrical modulation of the output pulse at time index k expressed in half bit clock periods.

21. A signal converter according to claim 1, wherein at least one of the linear correction filters comprises a Finite Impulse Response (FIR) filter or an Infinite Impulse Response (IIR) filter or wherein the linear correction filters of at least one set of correction signal paths comprise respective FIR filters or IIR filters.

22. A signal converter according to claim 1, wherein the linear correction filters of at least one set of correction signal paths are constituted by respective FIR filters.

23. A signal converter according to claim 1, wherein the non-linear generator function or functions of at least one set of correction signal paths comprise respective memoryless non-linearities.

24. A signal converter according to claim 1, wherein the non-linear generator function or functions of at least one set of correction signal paths comprise respective static non-linearities.

25. A signal converter according to claim 1, wherein the non-linear generator function or functions of at least one set of correction signal paths comprise respective polynomial non-linearities.

26. A signal converter according to claim 1, wherein a transfer function of a linear correction filter compensates at least one transfer function of at least one corresponding linear and time invariant model filter or linear and time invariant filter being substantially identical to said model filter, the at least one corresponding linear and time invariant model filter being generated by a signal model of an inherent non-linearity in the conversion of the PCM input signal into the UPWM output signal, the signal model being constituted by a model wherein the PCM model signal is filtered by a plurality of model signal paths that each comprises a model polynomial non-linearity of order 1 in series with an associated linear and time invariant model filter, $A_l(z)$, defined as:

$$A_l(z) = \sum_i a_{il} z^i, \text{ where } z = e^{j\omega}, l$$

being a running integer filter index $>=1$ and where $a_{il}$ represents a filter coefficient of the associated linear and time invariant model filter with index l.

27. A signal converter according to claim 26, wherein the filter coefficients $a_{il}$ of each of the associated linear and time-invariant model filters, $A_l(z)$, are determined based on a Taylor development of an inherent non-linearity in a particular type of PCM to UPWM signal conversion.

28. A digital amplifier or digital power amplifier comprising a signal converter according to claim 1.

29. A digital-to-analogue converter comprising a signal converter according to claim 1.

30. A method of converting a PCM input signal into a UPWM output signal, the method comprising the steps of:
provoking a UPWM converter input signal to a UPWM converter generating the UPWM output signal in the form of output pulses of variable widths based on the UPWM converter input signal,
applying the PCM signal to a first set of correction signal paths of the signal converter, each correction signal path comprising a non-linear generator function in series with a linear correction filter,
generating a first set of respective correction signals by the first set of correction signal paths of the signal converter in response to the PCM signal,
combining the first set of respective correction signals and the PCM signal to provide an error-corrected PCM signal,
the first set of correction signal paths comprising at least one correction signal path,
the error-corrected PCM signal suppressing at least one of non-linearity and noise generation within the signal converter caused by the conversion of the PCM input signal into the UPWM output signal.

31. A method according to claim 30, further comprising the steps of:
applying a second PCM signal to a second set of correction signal paths of the signal converter, each correction signal path of the second set of correction signal paths comprising a non-linear generator function in series with a linear correction filter,
generating a second set of respective correction signals by the second set of correction signal paths of the signal converter in response to the second PCM signal.

32. A method according to claim 31, wherein the first set of respective correction signals and the second set of respective correction signals are combined with the first PCM signal to provide the error-corrected PCM signal.

33. A method according to claim 30, wherein each correction signal path of the first set of correction signal paths forms part of a respective feed-forward loop within the signal converter,
the first set of respective correction signals thereby correcting earlier occurring signal samples of the first PCM signal.

34. A method according to claim 33, further comprising the steps of:
applying the PCM signal to a linear signal path,
generating the first PCM signal in response to the PCM signal,
thereby forming the error-corrected PCM signal by combining the first PCM signal and the first set of respective correction signals.

35. A method according to claim 34, wherein the PCM signal is the PCM input signal of the signal converter or an associated PCM signal derived from the PCM input signal,
the first set of correction signal paths and the linear signal path thereby forming a feed-forward structure that generates the error-corrected PCM signal.

36. A method according to claim 34, further comprising the steps of:

applying the error-corrected PCM signal to a noise shaper,
generating a quantized and noise-shaped PCM signal in response to the error-corrected PCM signal,
applying the quantized and noise-shaped PCM signal to an input of the UPWM converter.

37. A method according to claim 36, further comprising the steps of:
applying a third PCM signal to a third set of correction signal paths,
generating a third set of respective correction signals,
each correction signal path of the third set of correction signal paths comprising a non-linear generator function in series with a linear correction filter,
the third set of correction signal paths comprising one or several correction signal paths,
combining the second set of respective correction signals and the third set of respective correction signals in a second summing unit in series with the noise shaper to generate a second error-corrected PCM signal,
generating the second set of respective correction signals by applying the error-corrected PCM signal to the second set of correction signal paths,
applying the quantized and noise-shaped PCM signal of the noise shaper to the third set of correction signal paths to generate the third set of respective correction signals,
using the quantized and noise-shaped PCM signal of the noise shaper as the input signal of the UPWM converter.

38. A method according to claim 37, comprising the steps of:
providing the UPWM converter as a quasi-symmetrical UPWM converter generating the UPWM output signal in the form of symmetrical and asymmetrical output pulses of variable widths in response to a fourth PCM signal,
generating a fourth set of respective correction signals by a fourth set of respective correction signal paths receiving the fourth PCM signal,
the fourth set of correction signal paths comprising at least one correction signal path having a non-linear generator function and generating at least one correction signal,
providing a generator signal in response to a dynamic indication of a symmetry form of the symmetrical and asymmetrical output pulses to form provide the at least one correction signal by the fourth set of correction signal paths,
combining in a third summing unit the at least one correction signal and the error-corrected PCM signal to provide a third error-corrected PCM signal,
providing the third error-corrected PCM signal to the input of the second summing unit.

39. A method according to claim 30, wherein each correction signal path of the first set of correction signal paths forms part of a respective feed-back loop within the signal converter,
the first set of respective correction signals thereby correcting later occurring signal samples of the first PCM signal.

40. A method according to claim 39, further comprising the steps of:
providing the UPWM converter as a quasi-symmetrical UPWM converter generating the UPWM output signal in the form of symmetrical and asymmetrical output pulses of variable widths in response to the UPWM converter input signal, applying the PCM signal to an input of the quasi-symmetrical UPWM converter, providing a dynamic indication of a symmetry form of an output pulse of the quasi-symmetrical UPWM converter to at least one non-linear generator function of the first set of correction signal paths, providing a generator signal in response to the dynamic indication of a symmetry form of an output pulse to form at least one correction signal, thereby feeding back and combining the at least one correction signal to the first PCM signal to form the error-corrected PCM signal so as to suppress an inherent non-linearity of the quasi-symmetrical UPWM converter.

41. A method according to claim 31, wherein each correction signal path of the first set of correction signal paths forms part of a respective feed-forward loop within the signal converter, and each correction signal path of the second set of correction signal paths forms part of a respective feed-back loop within the signal converter, the method further comprising the step of:
combining the first and second sets of respective correction signals with the first PCM signal to provide the error-corrected PCM signal.

42. A method according to claim 41, further comprising the steps of:

applying the PCM signal to a noise shaping signal path having the summing unit arranged in series with a noise shaper, generating a quantized and noise-shaped PCM signal by the noise shaper, feeding forward the first set of respective correction signals, and applying the quantized and noise-shaped PCM signal to the second set of correction paths to feed-back the second set of respective correction signals, combing the first and second sets of respective correction signals with the first PCM signal, whereby the error-corrected PCM signal is applied to the input of the noise shaper to suppress intermodulation noise in the UPWM output signal due to the non-linear UPWM conversion process being applied to the quantized and noise-shaped PCM signal.

43. A method according to claim 30, wherein the linear correction filters of at least one set of correction signal paths is constituted by respective FIR filters.

44. A method according to claim 30, wherein the non-linear generator function function of at least one set of correction signal paths comprises respective polynomial non-linearities.

45. A method according to claim 30, further comprising the steps of:

adapting a transfer function of a linear correction filter to compensate at least one transfer function of at least one corresponding linear and time invariant model filter or linear and time invariant filter being substantially identical to said model filter, generating the at least one corresponding linear and time invariant model filter from a signal model of an inherent non-linearity in the conversion of the PCM input signal into the UPWM output signal, the signal model being constituted by a model wherein the PCM model signal is filtered by a plurality of model signal paths that each comprises a model polynomial non-linearity of order 1 in series with an associated linear and time invariant model filter, $A_l(z)$, which is defined as:

$$A_l(z) = \sum_i a_{il} z^i, \text{ where } z = e^{j\omega}, l$$

being a running integer filter index $>=1$, and where $a_{il}$ represents a filter coefficient of the associated linear and time invariant model filter with index l.

46. A method according to claim 45, at least one of the following compensations:

a transfer unction of a first linear correction filter, $B_2(\omega)$, compensates a transfer function of a corresponding linear and time invariant model filter, $A_2(\omega)$, of the signal model, by setting:

$$B_2(\omega) = -A_2(\omega)$$

and a transfer function of a second linear correction filter, $B_3(\omega)$, compensates a transfer function of the corresponding linear and time invariant model filters, $A_2(\omega)$ and $A_3(\omega)$, by setting:

$$B_3(\omega) = 2A_2(\omega)A_2(2\omega/3) - A_3(\omega).$$

47. A method according to claim 46, wherein a transfer function of a third linear correction filter, $B_3(\omega)$, compensates a transfer function of the corresponding linear and time invariant model filter $A_2(\omega)$, $A_3(\omega)$ and $A_4(\omega)$, by setting:

$$B_4(\omega) = -A_2(\omega)[A_2^2(\omega/2) + 4A_2(3\omega/4)A_2(\omega/2) - 2A_3(3\omega/4)] + 3A_3(\omega)A_2(\omega/2) - A_4(\omega).$$

48. A method according to claim 46, wherein the filter coefficients $a_{il}$ of each of the associated linear and time-invariant model filters, $A_l(z)$, are determined based on a Taylor development of an inherent non-linearity in a particular type of PCM to UPWM signal conversion.

49. A method according to claim 48, wherein the particular type of PCM to UPWM signal conversion is a conversion of the PCM input signal into a UPWM output signal with class AD trailing edge modulation, the filter coefficients, $a_{il}$, of the associated linear and time invariant model filters, $A_l(z)$, defining the following l transfer functions:

$$A_l(\omega) = \frac{1}{l!}\left(\frac{-j\omega}{2}\right)^{(l-1)}$$

50. A method according to claim 48, wherein the particular type of PCM to UPWM signal conversion is a conversion of the PCM input signal into a UPWM output signal with class AD leading edge modulation, the filter coefficients, $a_{il}$, of the of the associated linear and time invariant model filters, $A_l(z)$, defining the following l transfer functions:

$$A_l(\omega) = \frac{1}{l!}\left(\frac{j\omega}{2}\right)^{(l-1)}$$

51. A method according to claim 48, wherein the particular type of PCM to UPWM signal conversion is a conversion of the PCM input signal into a UPWM output signal with class AD double-sided symmetrical modulation, the filter coefficients, $a_{il}$, of the associated linear and time invariant model filters, $A_l(z)$, defining the following l transfer functions:

$$A_l(\omega) = \frac{1}{l!}\left(\frac{j\omega}{4}\right)^{(l-1)}, \text{ for odd } l$$

$$A_l(\omega) = \frac{1}{l!}\left(\frac{j\omega}{4}\right)^{l}, \text{ for even } l$$

52. A method according to claim 48, wherein the particular type of PCM to UPWM signal conversion is a conversion of the PCM input signal into a UPWM output signal with class-BD double-sided symmetrical modulation, the filter coefficients, $a_{il}$, of the associated model filters, $A_l(z)$, defining the following l transfer functions:

$$A_l(\omega) = \frac{1}{l!}\left(\frac{j\omega}{4}\right)^{(l-1)}, \text{ for odd } l$$

$$A_l(\omega) = 0, \text{ for even } l.$$

* * * * *